(12) United States Patent
Cheng et al.

(10) Patent No.: US 7,868,374 B2
(45) Date of Patent: Jan. 11, 2011

(54) SEMITUBULAR METAL-OXIDE-SEMICONDUCTOR FIELD EFFECT TRANSISTOR

(75) Inventors: Kangguo Cheng, Guilderland, NY (US); Lawrence A. Clevenger, LaGrangeville, NY (US); Timothy J. Dalton, Ridgefield, CT (US); Louis L. Hsu, Fishkill, NY (US); Jack A. Mandelman, Flat Rock, NC (US)

(73) Assignee: International Business Machines Corporation, Armonk, NY (US)

( * ) Notice: Subject to any disclaimer, the term of this patent is extended or adjusted under 35 U.S.C. 154(b) by 78 days.

(21) Appl. No.: 12/034,899

(22) Filed: Feb. 21, 2008

(65) Prior Publication Data

US 2009/0212341 A1 Aug. 27, 2009

(51) Int. Cl.
*H01L 29/788* (2006.01)
(52) U.S. Cl. .................. 257/316; 257/330; 257/296
(58) Field of Classification Search ......... 257/366–367, 257/347, 314–320, E29.129, E29.13, E29.3, 257/E21.422, E21.68, E21.687, E21.688; 438/149, 479, 517, 201, 211, 257, 266, 277
See application file for complete search history.

(56) References Cited

U.S. PATENT DOCUMENTS

| | | | |
|---|---|---|---|
| 5,371,037 A | 12/1994 | Yonehara | |
| 5,580,802 A * | 12/1996 | Mayer et al. | 438/157 |
| 6,103,009 A | 8/2000 | Atoji | |
| 6,309,945 B1 | 10/2001 | Sato et al. | |
| 6,569,748 B1 | 5/2003 | Sakaguchi et al. | |
| 6,593,211 B2 | 7/2003 | Sato | |
| 6,855,982 B1 * | 2/2005 | Xiang et al. | 257/330 |
| 7,449,733 B2 * | 11/2008 | Inaba et al. | 257/250 |
| 2006/0267093 A1 * | 11/2006 | Tang et al. | 257/347 |
| 2008/0203462 A1 * | 8/2008 | Goarin | 257/316 |

* cited by examiner

*Primary Examiner*—Wai-Sing Louie
*Assistant Examiner*—Sue Tang
(74) *Attorney, Agent, or Firm*—Scully, Scott, Murphy & Presser, P.C.; H. Daniel Schnurmann

(57) ABSTRACT

An epitaxial semiconductor layer or a stack of a silicon germanium alloy layer and an epitaxial strained silicon layer is formed on outer sidewalls of a porous silicon portion on a substrate. The porous silicon portion and any silicon germanium alloy material are removed and a semitubular epitaxial semiconductor structure in a three-walled configuration is formed. A semitubular field effect transistor comprising inner and outer gate dielectric layers, an inner gate electrode, an outer gate electrode, and source and drain regions is formed on the semitubular epitaxial semiconductor structure. The semitubular field effect transistor may operate as an SOI transistor with a tighter channel control through the inner and outer gate electrodes, or as a memory device storing electrical charges in the body region within the semitubular epitaxial semiconductor structure.

9 Claims, 38 Drawing Sheets

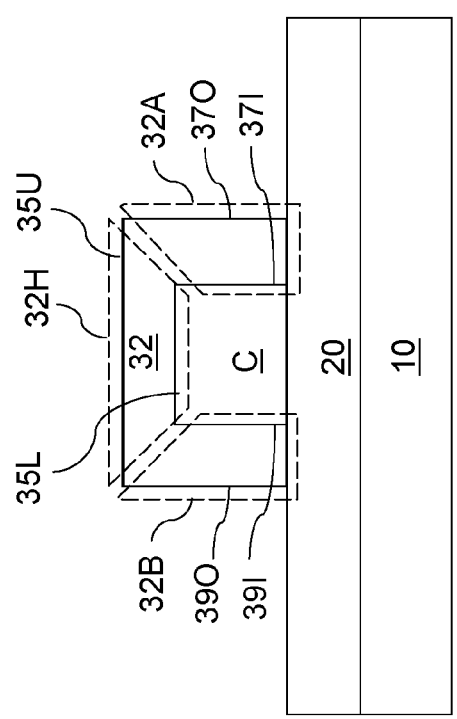

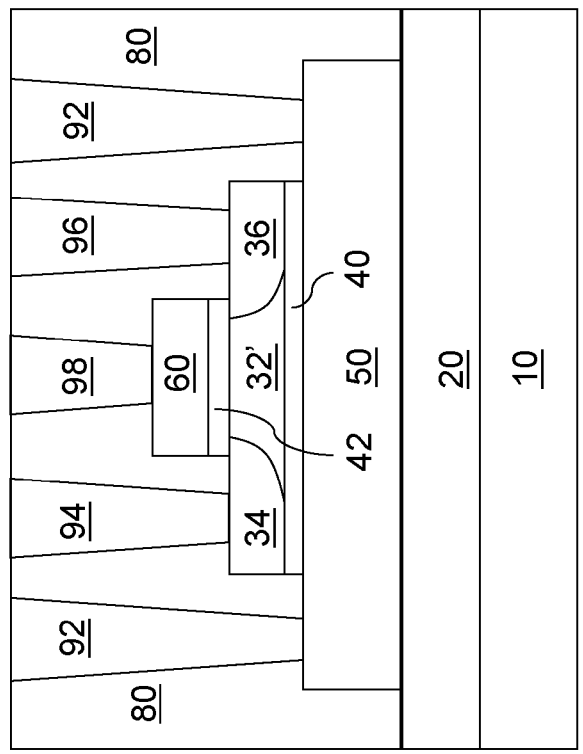
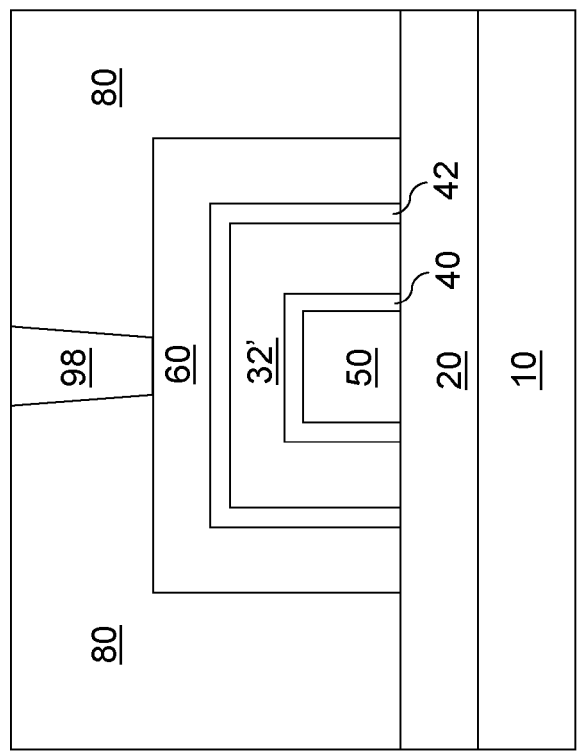
FIG. 13C
FIG. 13B

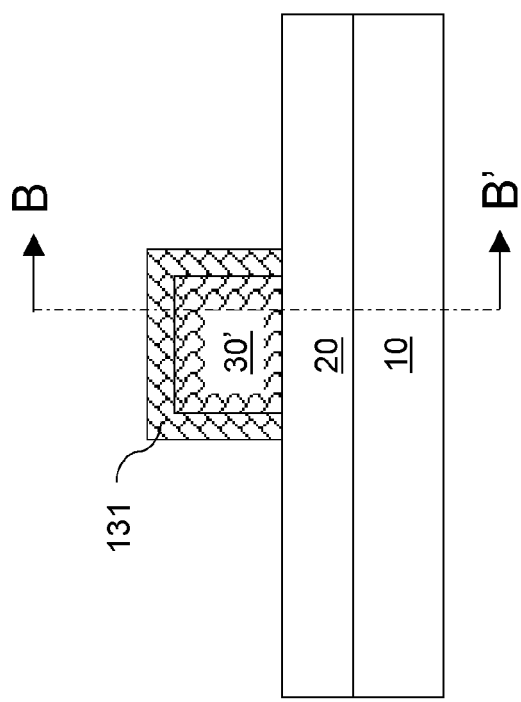
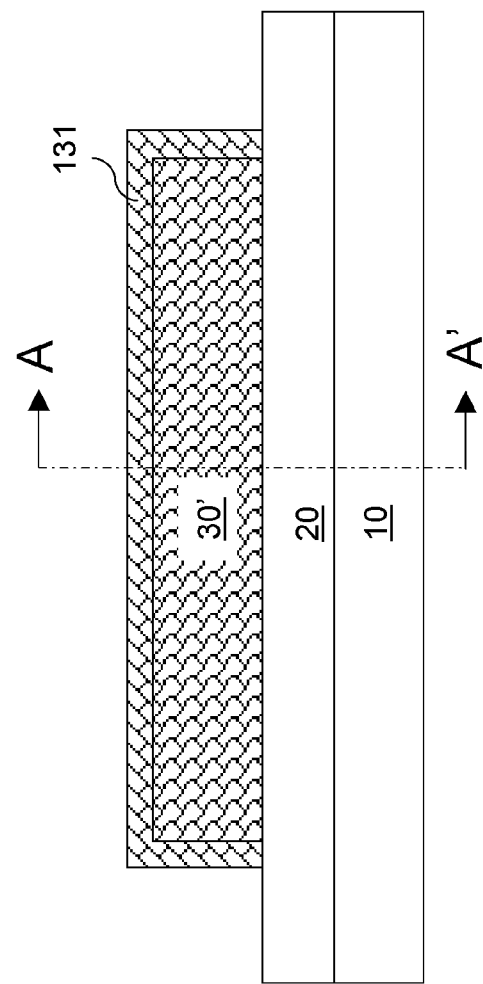

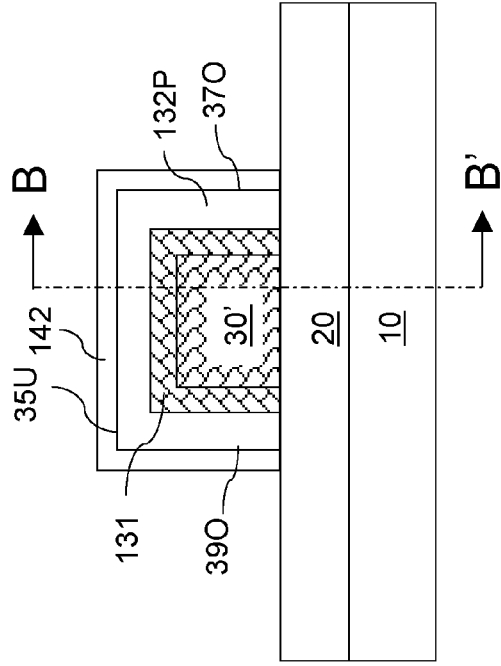
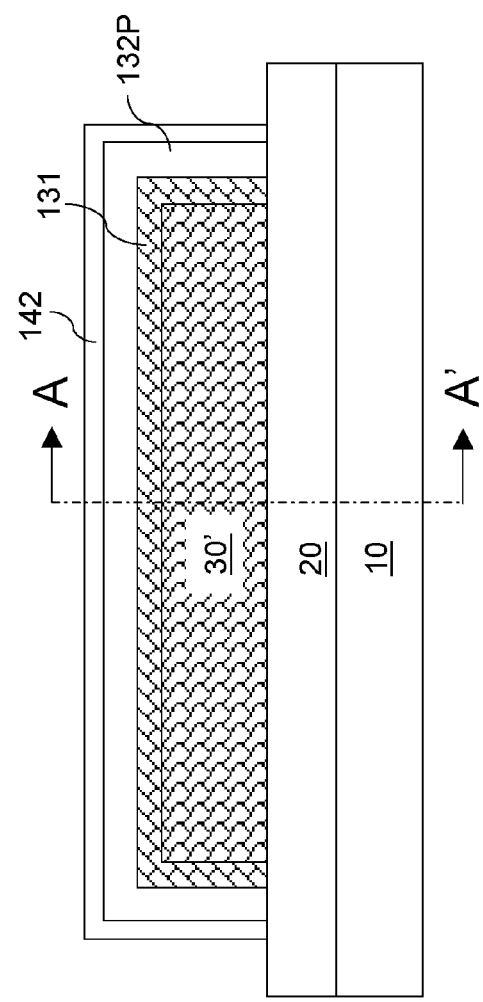

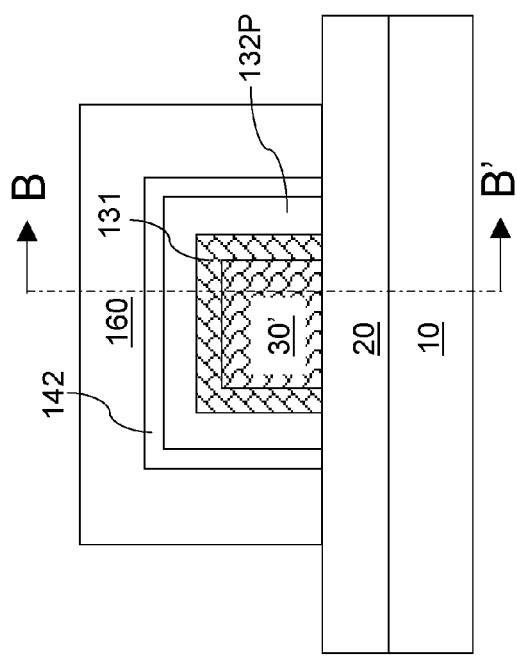
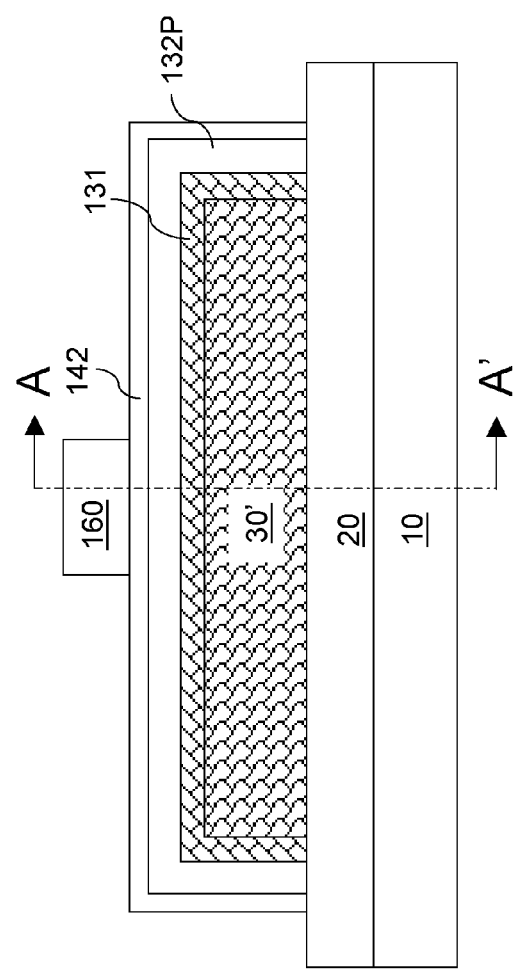
FIG. 17A
FIG. 17B

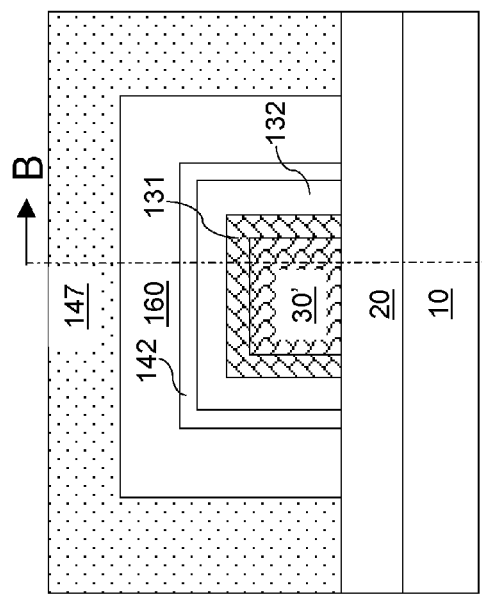
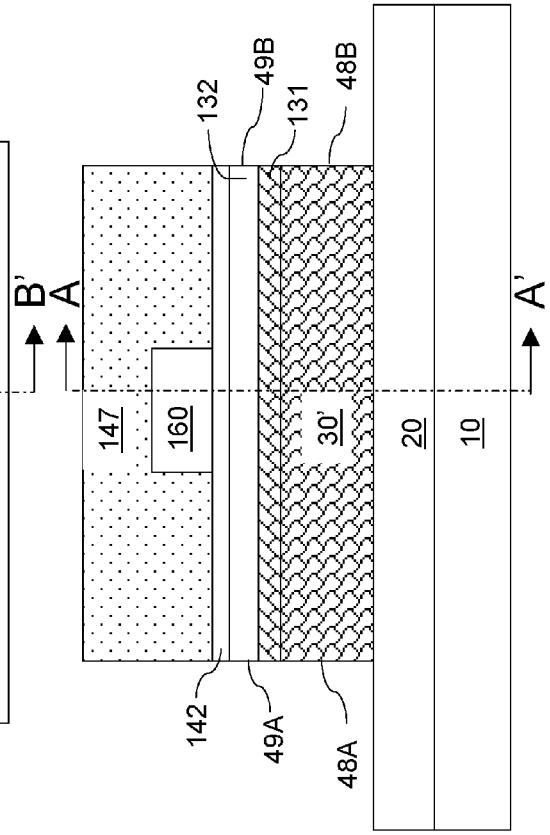

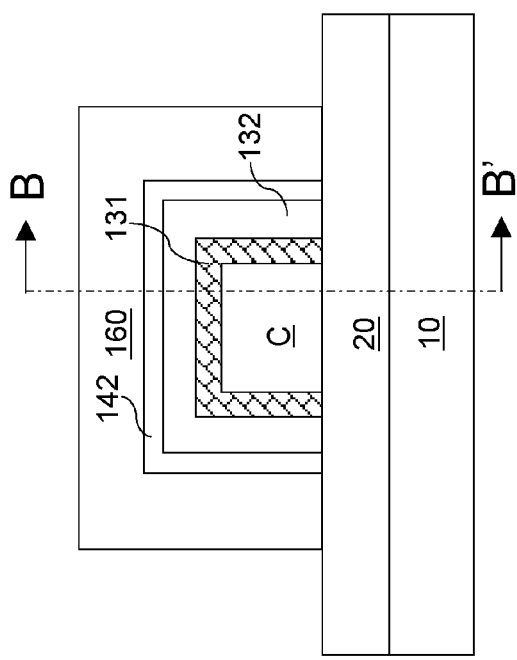
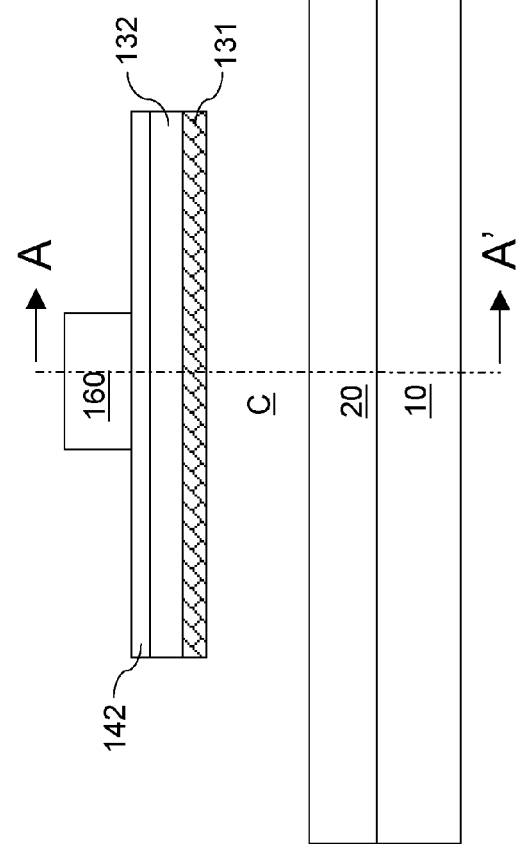

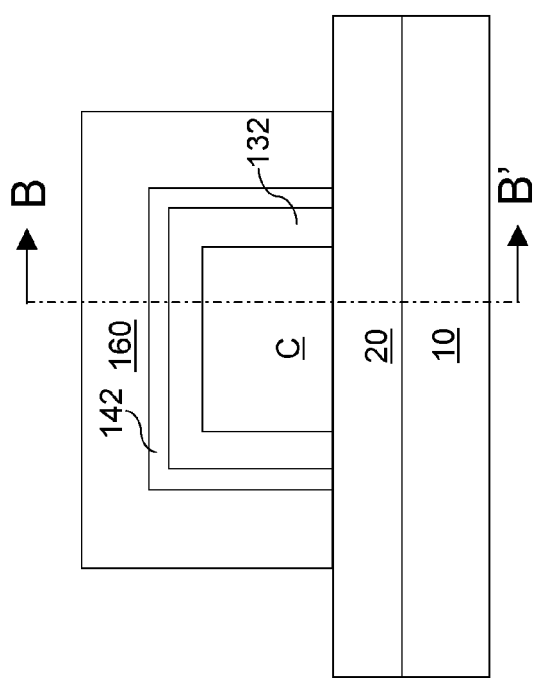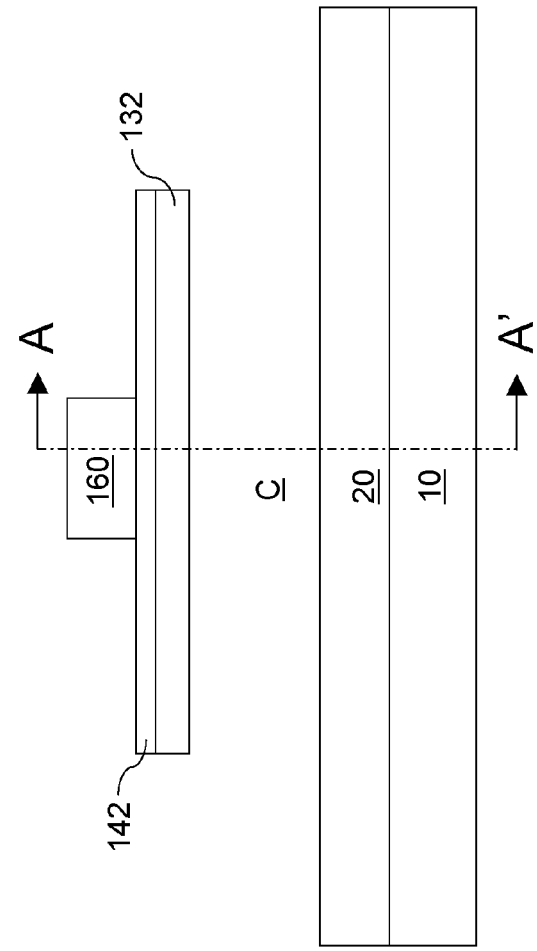

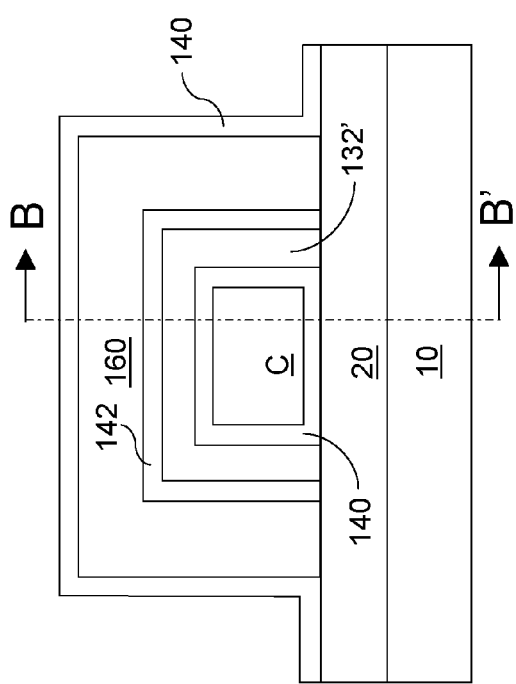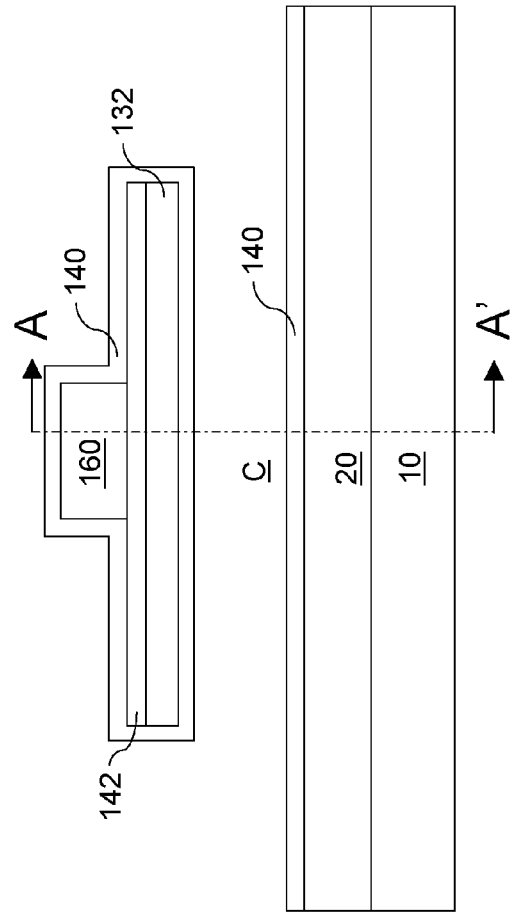

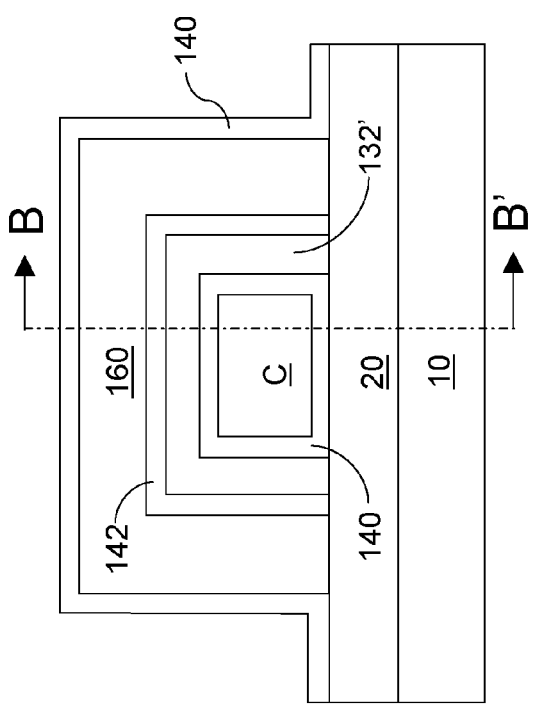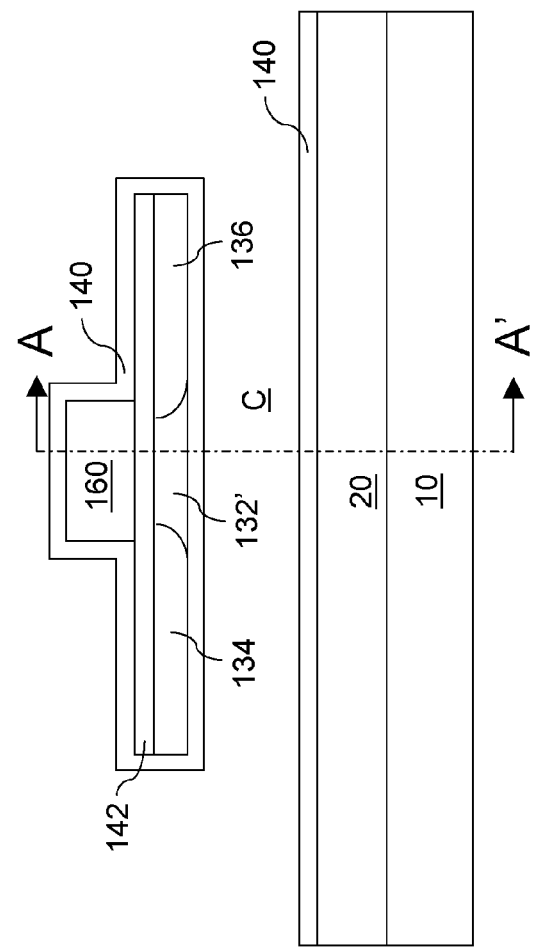

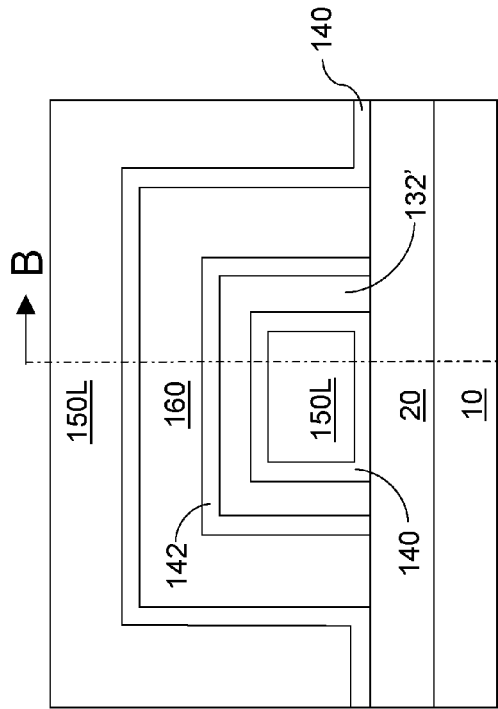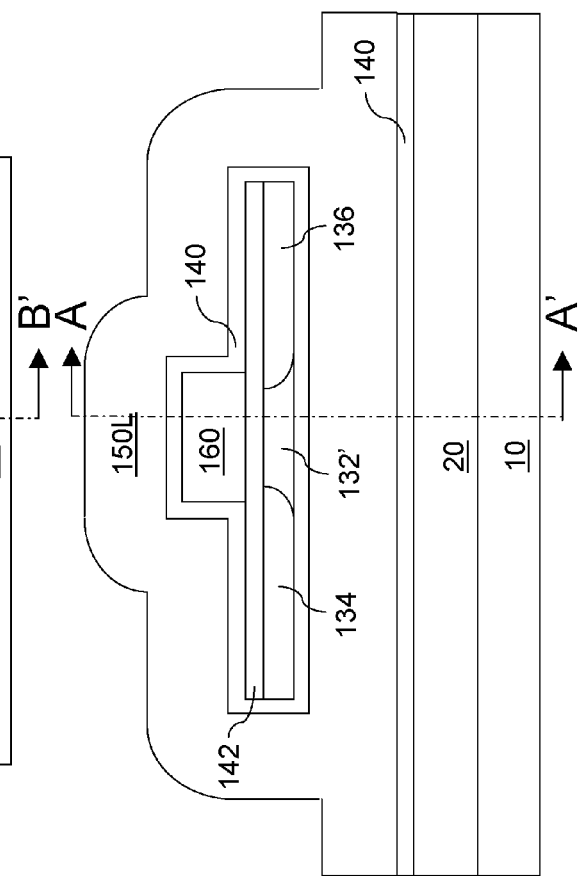

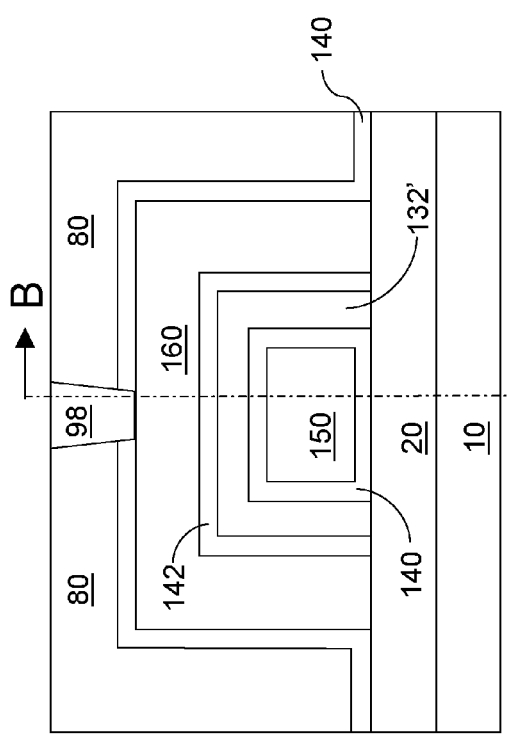
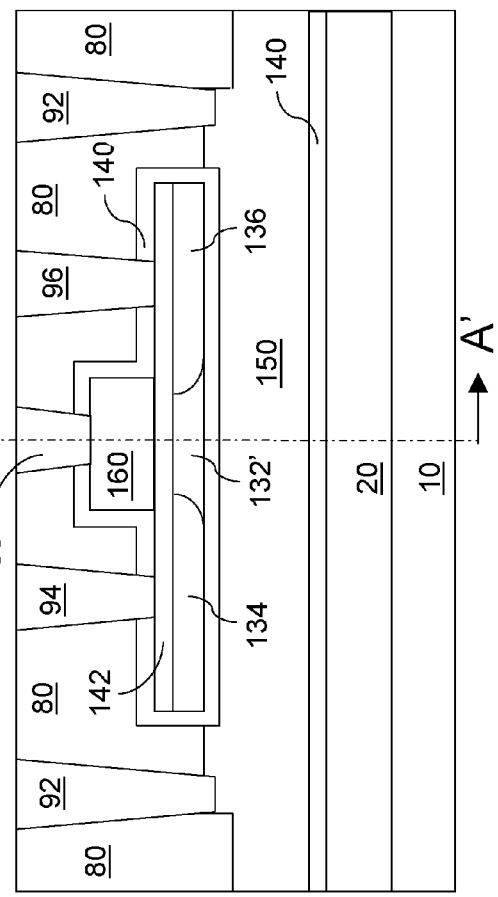

US 7,868,374 B2

SEMITUBULAR METAL-OXIDE-SEMICONDUCTOR FIELD EFFECT TRANSISTOR

FIELD OF THE INVENTION

The present invention relates to a metal-oxide-semiconductor semitubular field effect transistor (MOSFET) structures and methods of manufacturing the same.

BACKGROUND OF THE INVENTION

Continuous scaling of silicon-based metal oxide semiconductor field effect transistors (MOSFETs) has contributed to relentless advances in semiconductor technology. As the device scale approaches nanometer ranges, further scaling of semiconductor devices faces various challenges. Some challenges arise from the quantum mechanical nature of material properties at atomic dimensions such as gate tunneling current. Some other challenges arise from the stochastic nature of material properties such as fluctuations in dopant concentration on a microscopic scale, and resulting spread in threshold voltage and leakage current at semiconductor junctions. These and other challenges in semiconductor technology have renewed interest in semiconductor devices having non-conventional geometry.

A technology solution developed to enhance performance of complementary metal-oxide-semiconductor (CMOS) devices and used extensively in advanced semiconductor devices is semiconductor-on-insulator (SOI) technology. While an SOI MOSFET typically offers advantages over a MOSFET with comparable dimensions and built on a bulk substrate by providing a higher on-current and lower parasitic capacitance between the body and other MOSFET components, the SOI MOSFET tends to have less consistency in the device operation due to "history effect," or "floating body effect," in which the potential of the body, and subsequently, the timing of the turn-on and the on-current of the SOI MOSFET are dependent on the past history of the SOI MOSFET. Furthermore, the level of leakage current also depends on the voltage of the floating body, which poses a challenge in the design of a low power SOI MOSFET.

The body of an SOI MOSFET stores charge which is dependent on the history of the device, hence becoming a "floating" body. As such, SOI MOSFETs exhibit threshold voltages which are difficult to anticipate and control, and which vary in time. The body charge storage effects result in dynamic sub-threshold voltage (sub-Vt) leakage and threshold voltage (Vt) mismatch among geometrically identical adjacent devices.

One exemplary semiconductor device in which the floating body effects in SOI MOSFETs are particularly a concern is static random access memory (SRAM) cells, in which Vt matching is extremely important as operating voltages continue to scale down. The floating body also poses leakage problems for pass gate devices. Another exemplary semiconductor device in which the floating body effects are a concern is stacked SOI MOSFET structures, as used in logic gates, in which the conductive state of SOI MOSFET devices higher up in the stack are strongly influenced by stored body charge, resulting in reduced gate-to-source voltage (Vgs) overdrive available to these devices. Yet other exemplary semiconductor devices in which control of the floating body effects is critical are sense amplifiers for SRAM circuits and current drivers in a current mirror circuit.

In view of the above, there exists a need for a semiconductor structure minimizing the floating body effect and providing consistent performance, and methods of manufacturing the same.

Further, there exists a need for a semiconductor structure that advantageously employs the floating body effect for useful function, and methods of manufacturing the same.

Yet further, there exists a need for a semiconductor structure that improves performance, for example, by increasing on-current per unit device area, over existing semiconductor devices, and methods of manufacturing the same.

SUMMARY OF THE INVENTION

The present invention addresses the needs described above by providing a metal-on-semiconductor field effect transistor (MOSFET) in a semitubular configuration and having an inner gate and an outer gate.

In the present invention, an epitaxial semiconductor layer or a stack of a silicon germanium alloy layer and an epitaxial strained silicon layer is formed on outer sidewalls of a porous silicon portion formed on a buried insulator layer of a semiconductor-on-insulator substrate. The porous silicon portion and any silicon germanium alloy material are removed selective to the epitaxial semiconductor layer or the epitaxial strained silicon layer to form a cavity within a semitubular epitaxial semiconductor structure in a three-walled configuration. An inner gate dielectric layer and outer gate dielectric layer are formed on the semitubular epitaxial semiconductor structure, followed by deposition of a gate electrode material, which is patterned to form an inner gate electrode and an outer gate electrode. A semitubular field effect transistor is formed by forming source and drain regions in the semitubular epitaxial semiconductor structure.

The inner gate electrode and the outer gate electrode may be operated with the same voltage polarity relative to the body of the semitubular epitaxial semiconductor structure to induce inversion layers on both sides and to reduce the floating body effect and to effect a tighter channel control. Alternately, the inner gate electrode and the outer gate electrode may be operated with opposite polarity relative to the source of the semitubular epitaxial semiconductor structure to induce an inversion layer on one side and an accumulation layer on the other side of the semitubular epitaxial semiconductor structure so that the floating body effect is amplified and the semitubular transistor may store electrical charges as a memory device.

According to an aspect of the present invention, a semiconductor structure is provided which comprises:

a substrate including an insulator layer;

an epitaxial semiconductor structure including a horizontal layer separated from the insulator layer, a first vertical layer vertically abutting the insulating layer, a second vertical layer abutting the insulating layer and not abutting the first vertical layer;

an inner gate electrode insulated from the epitaxial semiconductor structure and located between the first and second vertical layers and between the horizontal layer and the insulating layer; and an outer gate electrode insulated from the epitaxial semiconductor structure and located over the epitaxial semiconductor structure.

The epitaxial semiconductor structure may be an epitaxial silicon structure, i.e., may consist of undoped or doped silicon.

In one embodiment, an entirety of the epitaxial semiconductor structure is of integral construction and epitaxially aligned as a single crystal.

In another embodiment, the inner gate electrode and the outer gate electrode comprise a same conductive material.

In even another embodiment, the semiconductor structure further comprises:

an inner gate dielectric abutting the inner gate electrode and the epitaxial semiconductor structure; and an outer gate dielectric abutting the outer gate electrode and the epitaxial semiconductor structure.

In yet another embodiment, the inner gate dielectric and the outer gate dielectric comprise a same dielectric material.

In still another embodiment, the horizontal layer has an upper surface and a lower surface, the first vertical layer has a first vertical inner wall and a first vertical outer wall, the second vertical layer has a second vertical inner wall and a second vertical outer wall, wherein the inner gate dielectric abuts the lower surface, the first vertical inner wall, and the second vertical inner wall, and wherein the outer gate dielectric abuts the upper surface, the first vertical outer wall, and the second vertical outer sidewall.

In still yet another embodiment, the inner gate electrode abuts the insulator layer and the outer gate electrode abuts the insulator layer.

In a further embodiment, the semiconductor structure further comprises:

a body region located in the epitaxial semiconductor structure and having a doping of a first conductivity type;

a source region having a doping of a second conductivity type and located at a first end of the epitaxial semiconductor structure, wherein the second conductivity type is the opposite of the first conductivity type; and a drain region having a doping of the second conductivity type and located at a second end of the epitaxial semiconductor structure and separated from the source region.

In an even further embodiment, the source region protrudes out of a first end surface of the outer gate electrode, the drain region protrudes out of a second end surface of the outer gate electrode, and the inner gate electrode protrudes out of an end surface of the epitaxial semiconductor structure.

In a yet further embodiment, the semiconductor structure further comprises:

a source side contact via abutting the source region;

a drain side contact via abutting the drain region;

an outer gate contact via abutting the outer gate electrode; and an inner gate contact via abutting the inner gate electrode.

In a still further embodiment, the horizontal layer, the first vertical layer, and the second vertical layer have a substantially same thickness.

According to another aspect of the present invention, a semiconductor structure is provided, which comprises:

a substrate including an insulator layer;

a strained epitaxial semiconductor structure including a horizontal layer separated from the insulator layer, a first vertical layer vertically abutting the insulating layer, a second vertical layer abutting the insulating layer and not abutting the first vertical layer;

an inner gate electrode located between the first and second vertical layers and between the horizontal layer and the insulating layer;

an outer gate electrode located over the epitaxial semiconductor structure;

a body region located in the epitaxial semiconductor structure and having a doping of a first conductivity type;

a source region having a doping of a second conductivity type and located at a first end of the epitaxial semiconductor structure, wherein the second conductivity type is the opposite of the first conductivity type; and a drain region having a doping of the second conductivity type and located at second end of the epitaxial semiconductor structure and separated from the source region.

The strained epitaxial semiconductor structure may be a strained epitaxial silicon structure, i.e., may consist of strained undoped silicon or strained doped silicon.

In one embodiment, an entirety of the strained epitaxial semiconductor structure is of integral construction, is epitaxially aligned as a single crystal, and has a substantially same strain throughout.

In another embodiment, the source region protrudes out of a first end surface of the outer gate electrode, the drain region protrudes out of a second end surface of the outer gate electrode, and the inner gate electrode protrudes out of an end surface of the strained epitaxial semiconductor structure.

According to yet another aspect of the present invention, a method of forming a semiconductor structure is provided, which comprises:

forming an epitaxial semiconductor structure having a doping of a first conductivity type on a substrate, wherein the epitaxial semiconductor structure includes a horizontal layer separated from the insulator layer, a first vertical layer vertically abutting the insulating layer, a second vertical layer abutting the insulating layer and not abutting the first vertical layer;

forming an inner gate electrode inside the epitaxial semiconductor structure;

forming an outer gate electrode outside the strained epitaxial semiconductor structure; and forming a source region and a drain region having a doping of a second conductivity type and at a first end and at a second end of the epitaxial semiconductor structure, respectively, wherein the second conductivity type is the opposite of the first conductivity type.

In one embodiment, an entirety of the strained epitaxial semiconductor structure is of integral construction, is epitaxially aligned as a single crystal.

In another embodiment, the epitaxial semiconductor structure has a substantially same non-zero strain throughout.

In even another embodiment, the method further comprises:

forming a gate electrode layer enclosing the epitaxial semiconductor structure, wherein the epitaxial semiconductor structure is encapsulated by the gate electrode layer and the substrate; and patterning the gate electrode layer, wherein the inner gate electrode and the outer gate electrode are formed from remaining portions of the gate electrode layer.

In yet another embodiment, the method further comprises:

forming a gate dielectric layer abutting the epitaxial semiconductor structure, wherein the epitaxial semiconductor structure is encapsulated by the gate dielectric layer and the substrate; and patterning the gate dielectric layer to form an outer gate electrode, wherein the outer gate electrode is formed directly on the outer electrode.

In still another embodiment, the method further comprises:

providing a semiconductor-on-insulator (SOI) substrate including a silicon layer and a buried insulator layer, wherein the insulator layer constitutes a portion of the substrate;

converting the silicon layer into a porous silicon layer having an epitaxial alignment and having a density less than 2.33 g/cm$^3$;

patterning the porous silicon layer into a porous silicon portion;

epitaxially growing the epitaxial semiconductor structure on the porous silicon portion; and removing the porous silicon portion selective to the epitaxial semiconductor structure.

In still yet another embodiment, the method further comprises:

epitaxially growing a silicon-germanium alloy layer directly on the porous silicon portion, wherein the epitaxial semiconductor structure is epitaxially grown directly on the silicon germanium alloy layer with a non-zero strain; and removing the silicon-germanium alloy layer selective to the epitaxial semiconductor structure.

According to still another aspect of the present invention, a floating-body dynamic random access memory device is provided, which comprises:

an insulator layer located on a substrate;

an epitaxial semiconductor structure including a horizontal layer separated from the insulator layer, a first vertical layer vertically abutting the insulating layer, a second vertical layer abutting the insulating layer and not abutting the first vertical layer;

an inner gate electrode insulated from the epitaxial semiconductor structure and located between the first and second vertical layers and between the horizontal layer and the insulating layer;

an outer gate electrode insulated from the epitaxial semiconductor structure and located over the epitaxial semiconductor structure.

a source region located at a first end of the epitaxial semiconductor structure;

a drain region located at a second end of the epitaxial semiconductor structure and separated from the source region; and a charge storage node in a center portion of the epitaxial semiconductor structure between the source region and the second region, wherein the storage node is partially depleted to store electrical charges.

In one embodiment, the inner gate and the outer gate are biased at different voltages.

In another embodiment, the charge storage node is a body region of the epitaxial semiconductor structure, and wherein the body region is a quasi-neutral floating body.

In even another embodiment, the source region, the drain region, the inner gate electrode, and the outer gate electrode are biased to generate electrical charges in the epitaxial semiconductor structure by impact ionization or gate-induced drain leakage current.

In yet another embodiment, the floating-body dynamic random access memory device is configured to determine a logic state by the amount of electrical charges within the charge storage node.

In still another embodiment, the floating-body dynamic random access memory device is configured to enable forward biasing of the drain region relative to the charge storage node to remove the electrical charges.

In still yet another embodiment, the floating-body dynamic random access memory device is configured to enable periodic refreshing of contents of the charge storage node to maintain a logic state.

BRIEF DESCRIPTION OF THE DRAWINGS

FIGS. 14A-25B are sequential vertical cross-sectional views of a second exemplary semiconductor structure according to a second embodiment of the present invention. Figures with the same numeric label correspond to the same stage of a manufacturing process. The plane of the vertical cross-section for figures with the suffix "A" is shown as the plane A-A' in the figure having the same numeric label and the suffix "B." The plane of the vertical cross-section for figures with the suffix "B" is shown as the plane B-B' in the figure having the same numeric label and the suffix "A."

DETAILED DESCRIPTION OF THE INVENTION

Figure 1A:
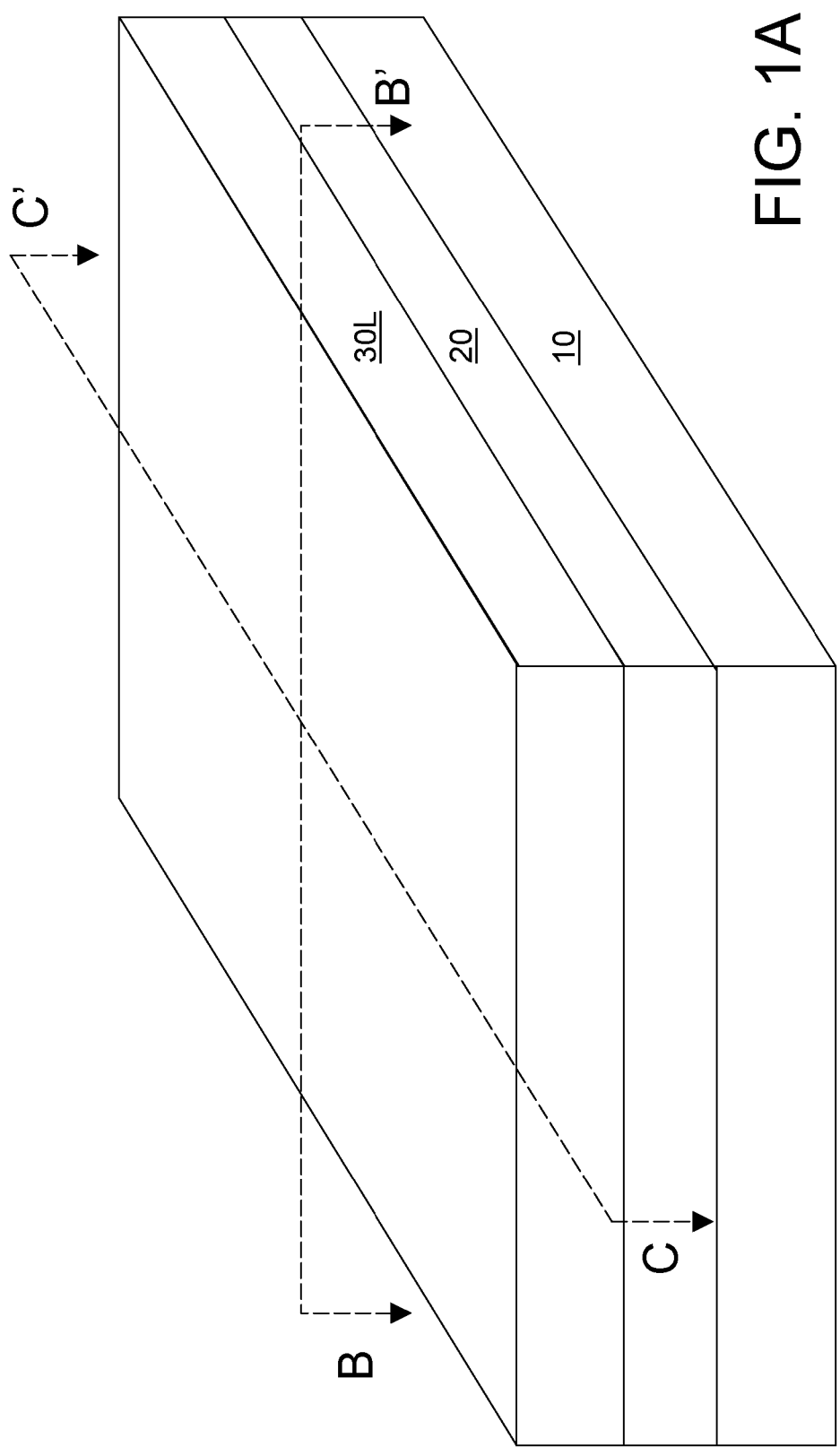
FIGS. 1A-13C are sequential views of a first exemplary semiconductor according to a first embodiment of the present invention. Figures with the same numeric label correspond to the same stage of a manufacturing process. Figures with the suffix "A" are bird's eye views. Figures with the suffix "B" or "C" are vertical cross-sectional views along the plane B-B' or C-C' respectively, of the corresponding figure with the same numeric label and the suffix "A."

As stated above, the present invention relates to a metal-oxide-semiconductor semitubular field effect transistor (MOSFET) structures and methods of manufacturing the same, which are now described in detail with accompanying figures. It is noted that like and corresponding elements are referred to by like reference numerals.

Figure 1B:
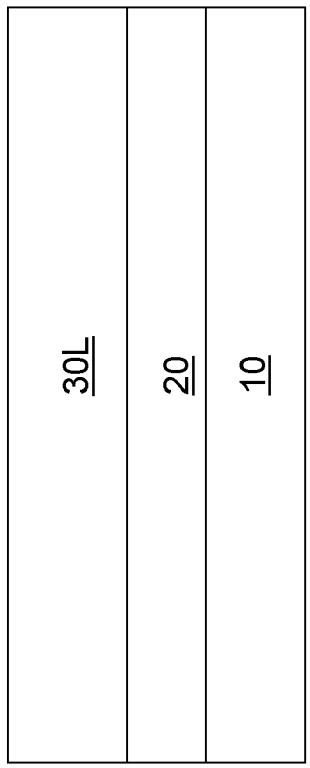
Figure 1C:

Referring to FIGS. 1A-1C, a first exemplary semiconductor structure according to a first embodiment of the present invention is shown, which comprises a semiconductor-on-insulator substrate including a handle substrate 8, an insulator layer 20, and a top silicon layer 30L. The handle substrate 10 may comprise a semiconductor material, metallic material, or an insulator material providing structural support for the insulator layer 20 and the top silicon layer 30L. The insulator layer 20 comprises an insulator material such as a dielectric oxide or a dielectric nitride. The insulator layer 20 may comprise a crystalline material or a non-crystalline material. For example, the insulator layer 20 may comprise silicon nitride, silicon oxynitride, silicon oxide, or a ceramic material.

A top portion of the insulator layer 20 comprises a material that may withstand a porosification process to be subsequently performed. The semiconductor material may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Typically, the semiconductor material comprises silicon.

The top silicon layer 30L comprises a single crystalline silicon material having an epitaxial alignment throughout. The top silicon layer 30L may have any crystallographic orientation including (001), (110), (111), etc. Also, the top silicon layer 30L may have any azimuthal orientation within the plane perpendicular to the top surface of the top silicon layer 30L. One useful crystallographic orientation is the orientation in which the top semiconductor layer 30L has a (001) surface orientation, i.e., perpendicular to the [001] direction, and the B-B' plane may includes a [100] direction. The single crystalline silicon material in the top silicon layer 30L has a diamond cubic structure with a lattice constant of about 0.5431 nm and a density of about 2.33 g/cm$^3$ at 300 K. The thickness of the top silicon layer 30L may be from about 30 nm to about 500 nm, and preferably from about 60 nm to about 200 nm, although lesser and greater thicknesses are explicitly contemplated herein.

Figure 2A:
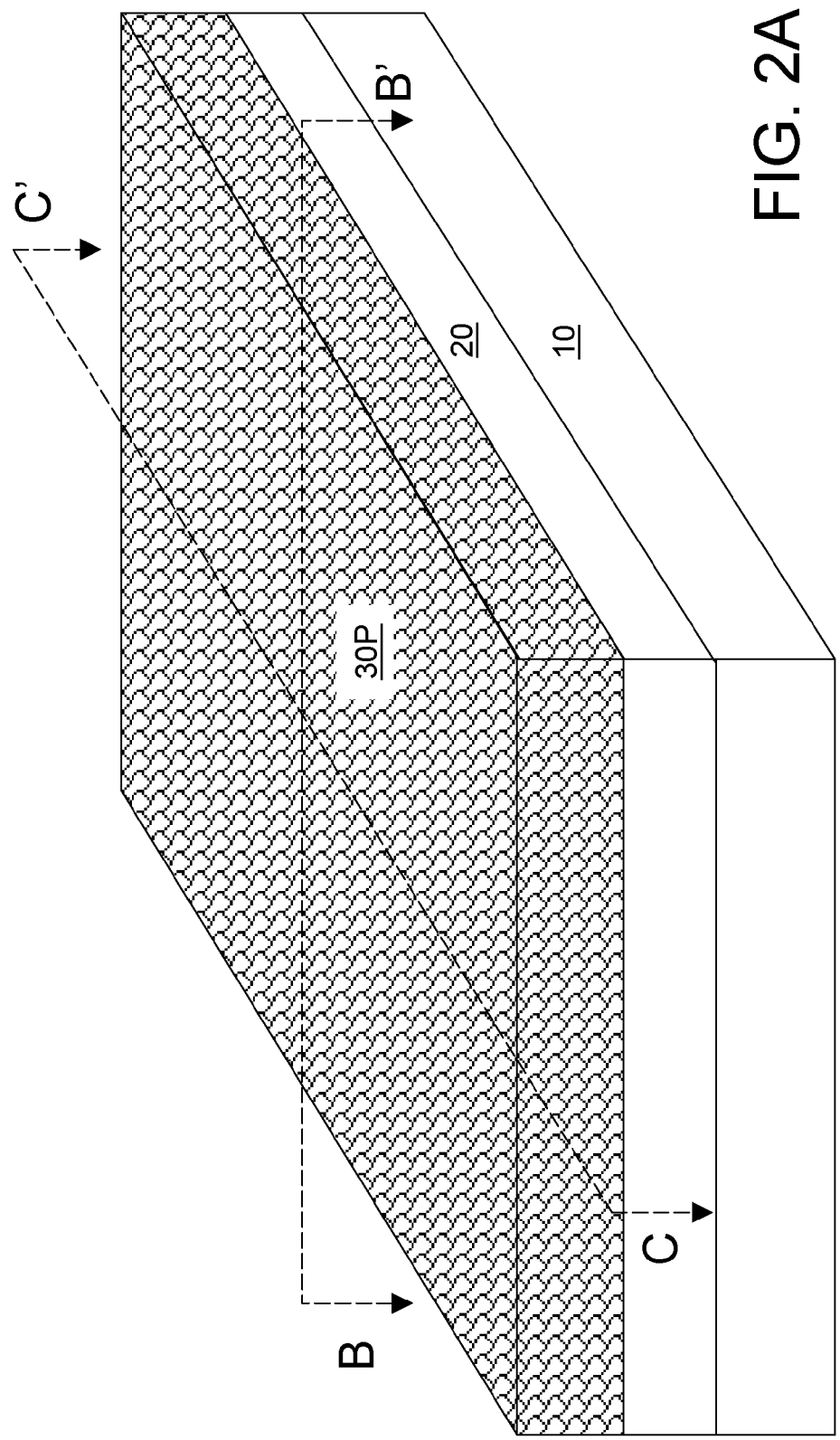
Figure 2B:
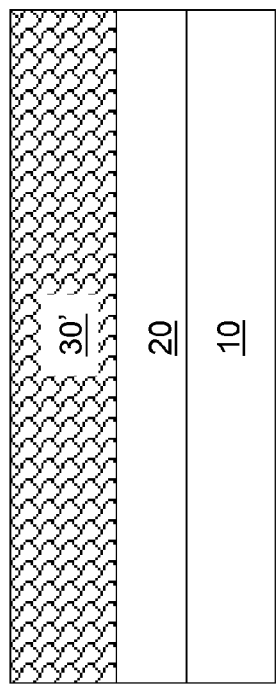
Figure 2C:
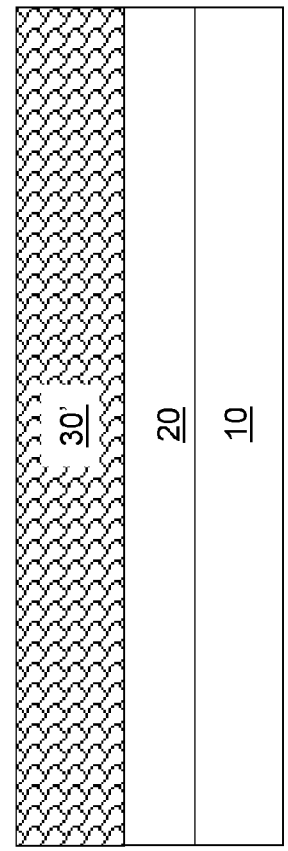

Referring to FIGS. 2A-2C, the top semiconductor layer 30L is converted to form a porous silicon layer 30P. Methods of converting a single crystalline silicon material to porous silicon are known in the art. U.S. Pat. No. 5,371,037 to Yonehara, U.S. Pat. No. 6,307,945 to Sato et al., U.S. Pat. No. 6,103,009 to Atoji, U.S. Pat. No. 6,569,748 to Sakaguchi et al., and U.S. Pat. No. 6,593,211 to Sato disclose methods of porosification of single crystalline silicon, and are incorporated herein by reference. The porous silicon layer 30L includes pores and has a density lower than 2.33 g/cm$^3$ at 300 K. Typical density for the porous silicon layer 30P may be from about 0.6 g/cm$^3$ to about 1.1 g/cm$^3$ at 300 K, although lesser and greater densities are also contemplated herein. The porous silicon layer 30P is single crystalline with an epitaxial alignment of silicon atoms throughout the entirety of the porous silicon layer 30P.

Figure 3A:
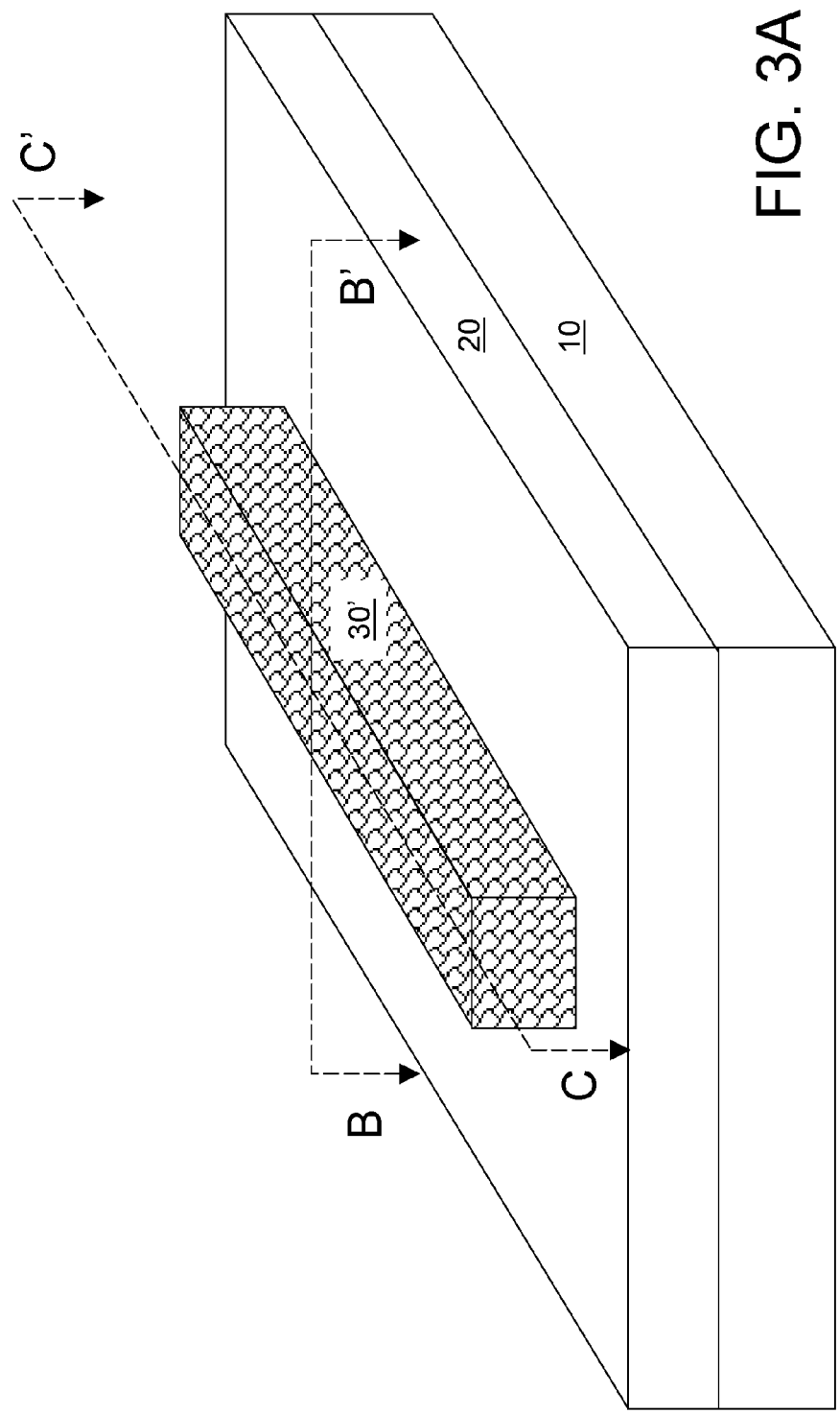
Figure 3B:
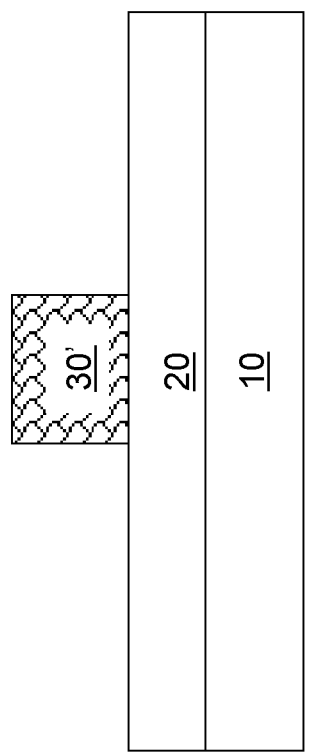
Figure 3C:
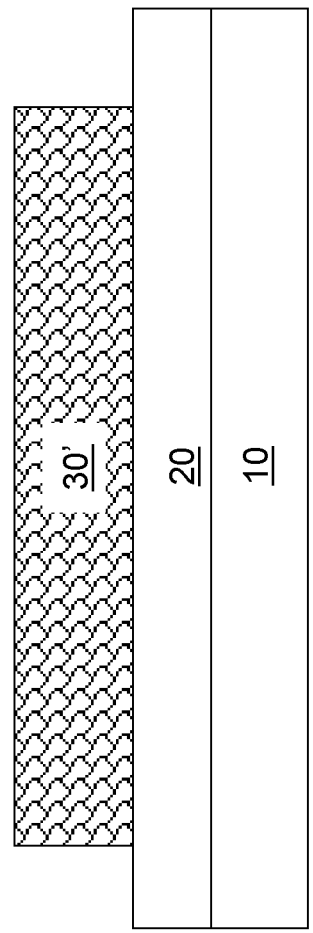

Referring to FIGS. 3A-3C, the porous silicon layer 30P is lithographically patterned into a porous silicon portion 30' having a shape of a generalized cylinder, which is a geometrical object having congruent and parallel top and bottom surfaces and at least one vertical sidewall. The congruent and parallel top and bottom surfaces may have any two dimensional shape and the entirety of the at least one vertical sidewall laterally encloses the shape. The generalized cylinder may be a prism, in which the congruent and parallel top and bottom surfaces are polygons. Preferably, the porous silicon portion 30' includes two parallel vertical rectangular sidewalls.

For example, the porous silicon portion 30' may be a rectangular parallelepiped having two parallel vertical rectangular sidewalls in planes that are parallel with C-C' plane and two parallel vertical end walls in planes that are parallel with the B-B' plane. In this case, the top surface and the bottom surface have a shape of a rectangle. In this case, the width of the porous silicon portion 30', as measured in a horizontal direction contained in the plane B-B' may be from about 10 nm to about 1,000 nm, and typically from about 30 nm to about 500 nm, although lesser and greater widths are also contemplated. The length of the silicon portion 30', as measured in a horizontal direction contained in the plane C-C' may be from about 50 nm to about 2,000 nm, and typically from about 100 nm to about 500 nm, although lesser and greater widths are contemplated herein also.

In a variation of the first embodiment, the processing steps for porosification and the processing steps for lithographic patterning may be reversed in order.

Figure 4A:
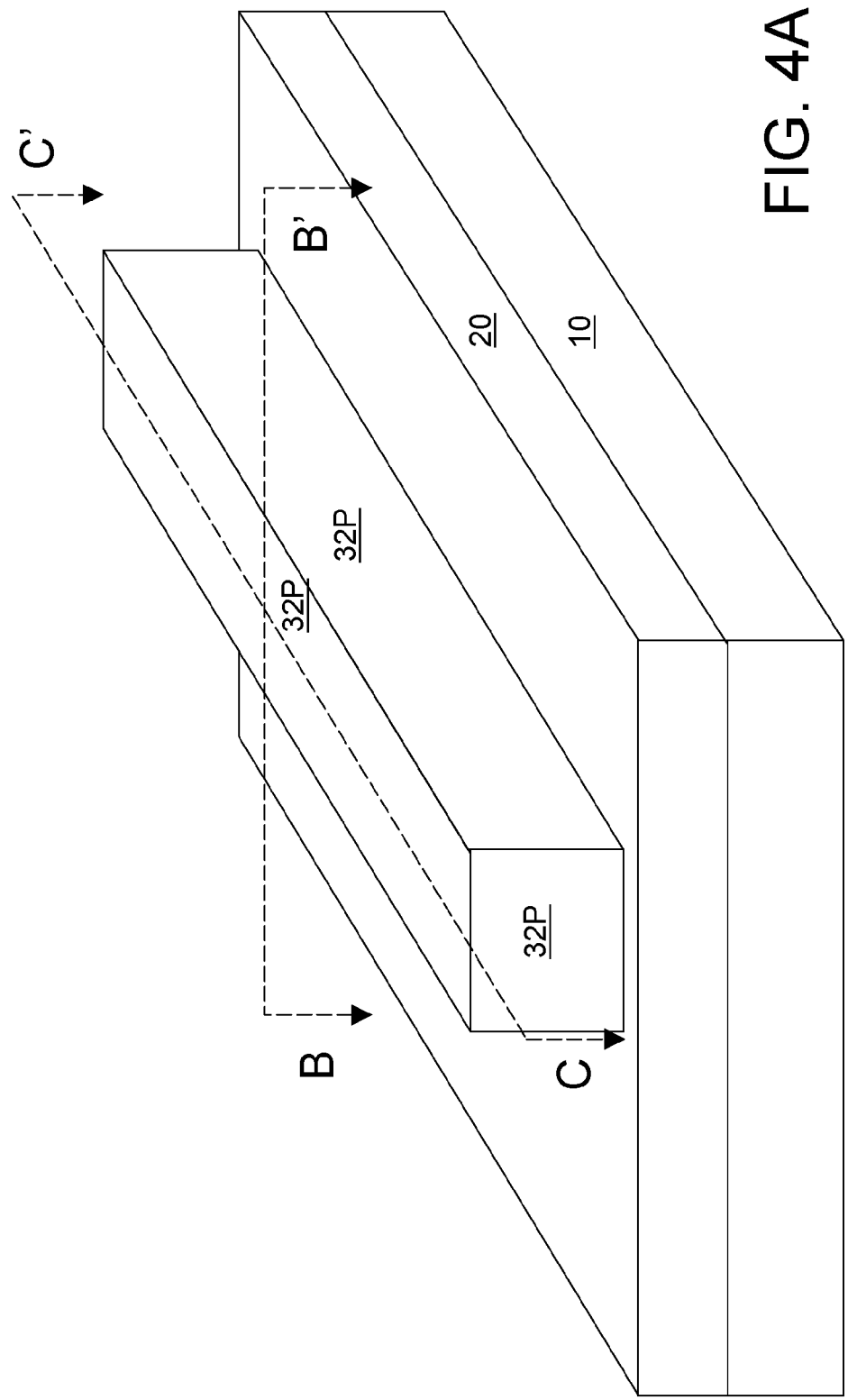
Figure 4B:
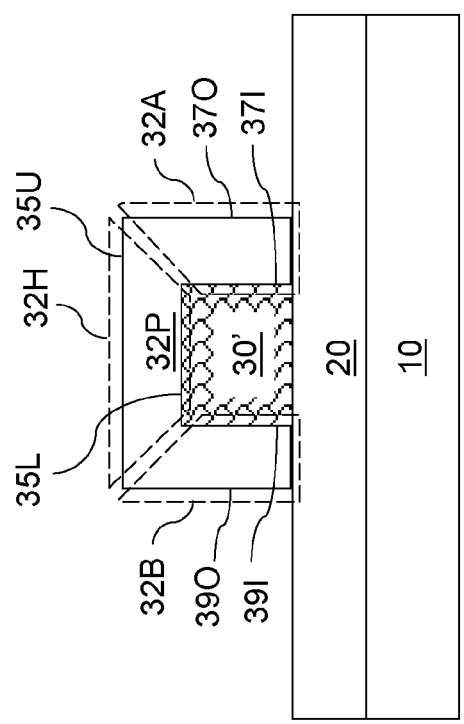
Figure 4C:
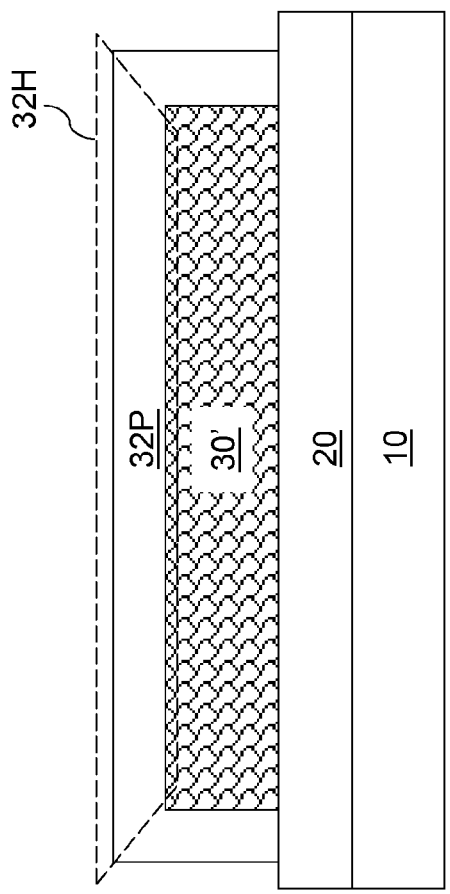

Referring to FIGS. 4A-4C, silicon is epitaxially deposited on exposed surfaces of the porous silicon portion 30' to form a prototypical epitaxial semiconductor structure 32P. The prototypical epitaxial semiconductor structure 32P may, or may not, consist of doped silicon or undoped silicon. In case the prototypical epitaxial semiconductor structure 32P comprises silicon, the first exemplary semiconductor structure is placed in a reactor and a silicon-containing reactant gas, which may be selected from $SiH_4$, $SiH_2Cl_2$, $SiHCl_3$, $SiCl_4$, $Si_2H_6$, etc., or a combination thereof, is flown into the reactor with a carrier gas such as $H_2$ or He to effect the deposition of the prototypical epitaxial semiconductor structure 32P. Deposition conditions described in the references incorporated above may be employed. Optionally, the surface of the porous silicon can be sealed by annealing in an atmosphere containing hydrogen before epitaxy process. In a variation of the first embodiment, heterogeneous epitaxy may be employed to epitaxially grow a semiconductor material different from the material of the porous silicon portion 30'.

In an embodiment of the present invention, the epitaxial deposition of silicon is performed selectively by flowing an etchant such as HCl into the reactor with the carrier gas and the reactant gas. Such an etchant makes the epitaxial deposition process selective so that silicon grows only on the surfaces of the porous silicon portion 30', and no growth of silicon occurs on the surfaces of the insulator layer 20. Alternately, the epitaxial deposition may proceed non-selectively, and polycrystalline portions of silicon, which grows on the surfaces of the insulator layer 20 in this case, are subsequently removed by lithographic patterning, for example, at the processing steps corresponding to FIGS. 5A-5C below.

The prototypical epitaxial semiconductor structure 32P comprises a horizontal layer 32H, a first vertical layer 32A, and a second vertical layer 32B. The horizontal layer 32H has an epitaxial semiconductor upper surface 35U and an epitaxial semiconductor lower surface 35L, and is separated from the insulator layer 20 by the porous silicon portion 30', the first vertical layer 32A, and the second vertical layer 32B. The first vertical layer 32A has a first vertical inner wall 37I and a first vertical outer wall 37O and the second vertical layer 32B has a second vertical inner wall 39I and a second vertical outer wall 39O. The entirety of the prototypical epitaxial semiconductor structure 32P and the porous silicon portion 30' are single crystalline. The thickness of the prototypical epitaxial semiconductor structure 32P as measured on the horizontal layer 32H may be from about 10 nm to about 500 nm, and typically from about 20 nm to about 50 nm, although lesser and greater thicknesses are contemplated herein also.

In case the surface orientation of the epitaxial semiconductor upper surface 35U, i.e., the surface orientation of the horizontal layer 32H, is equivalent to the surface orientations of the first and second vertical outer walls (37O, 39O), i.e., the surface orientations of the first and second vertical layers (32A, 32B), the thickness of the prototypical epitaxial semiconductor structure 32P is the same across the horizontal layer 32H, the first vertical layer 32A, and the second vertical layer 32B. For example, the epitaxial semiconductor upper surface 35U may have a (001) surface orientation, the first vertical outer wall 37O may have a (100) surface orientation, and the second vertical outer well 39O may have a ($\bar{1}$00) surface orientation. In another example, the epitaxial semiconductor upper surface 35U may have a (110) surface orientation, the first vertical outer wall 37O may have a (1$\bar{1}$0) surface orientation, and the second vertical outer well 39O may have a ($\bar{1}$10) surface orientation. Different surface orientations in general may lead to different thicknesses in epitaxial material if the surface orientations are not crystallographically equivalent. Since there is a lattice match between the prototypical epitaxial semiconductor structure 32P and the porous silicon portion 30', there is no strain in the prototypical epitaxial semiconductor structure 32P.

The prototypical epitaxial semiconductor structure 32P may be substantially undoped, doped with p-type dopants, or doped with n-type dopants as grown on the porous silicon portion 30'. In one embodiment, the prototypical epitaxial semiconductor structure 32P is formed with an in-situ doping, in which dopants of a first conductivity type are incorporated into the prototypical epitaxial semiconductor structure 32P during the epitaxial growth. The first conductivity type may be p-type or n-type. In another embodiment, the prototypical epitaxial semiconductor structure 32P is formed without any doping, and the prototypical epitaxial semiconductor structure 32P as formed is substantially intrinsic. Dopants of a first conductivity type are implanted into the porous silicon portion 30' by ion implantation. The dopant concentration of the prototypical epitaxial semiconductor structure 32P, either as grown with in-situ doping or as doped with ion implantation, may be from about $1.0\times10^{15}$/cm$^3$ to about $3.0\times10^{18}$/cm$^3$, and preferably from about $1.0\times10^{15}$/cm$^3$ to about $3.0\times10^{17}$/cm$^3$, although lesser and greater dopant concentrations are explicitly contemplated herein. If the prototypical epitaxial semiconductor structure 32P is intrinsic as grown, the ion implantation may be performed at a processing step corresponding to FIGS. 6A-6C either before or after the removal of the porous silicon portion 30'.

Figure 5A:
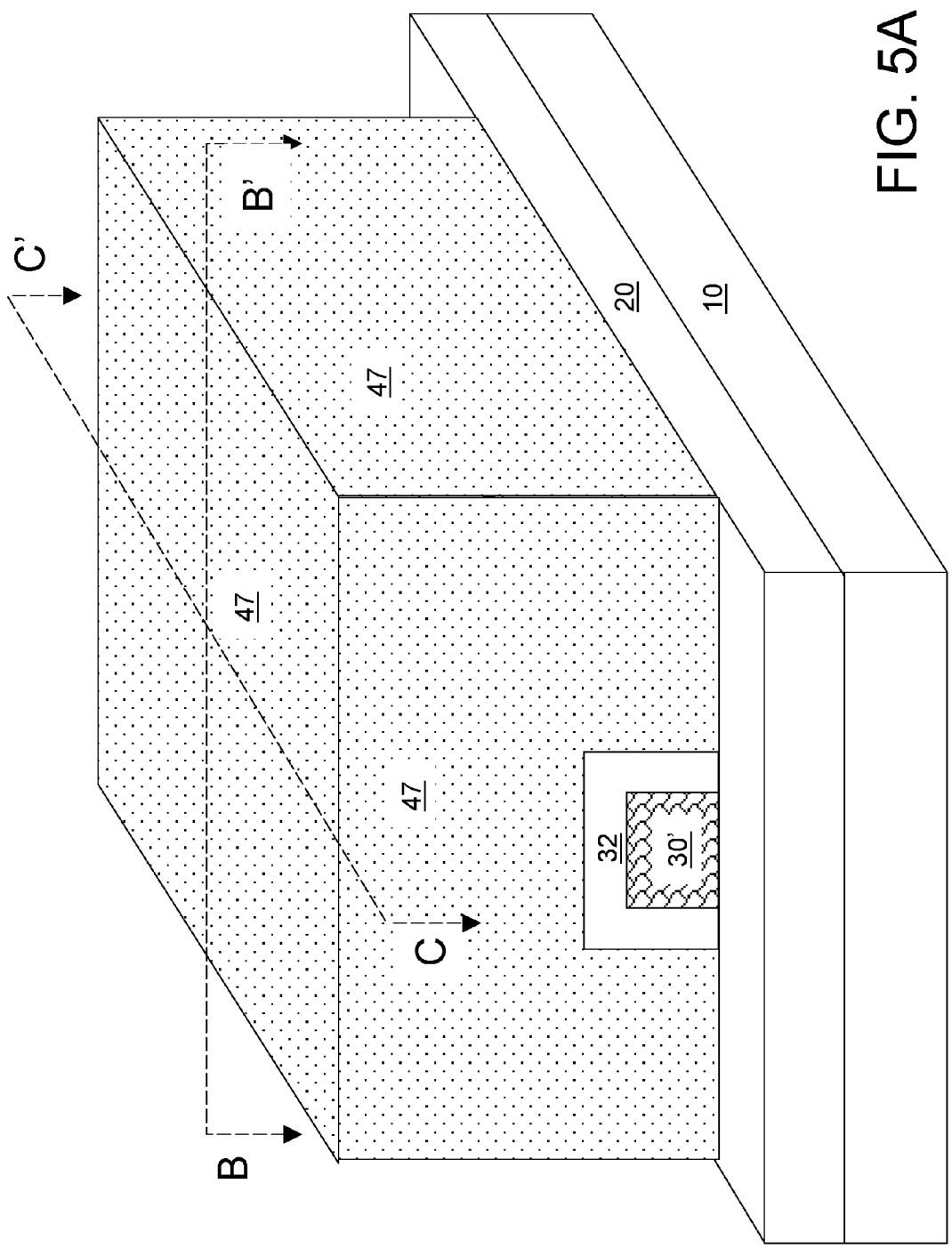
Figure 5B:
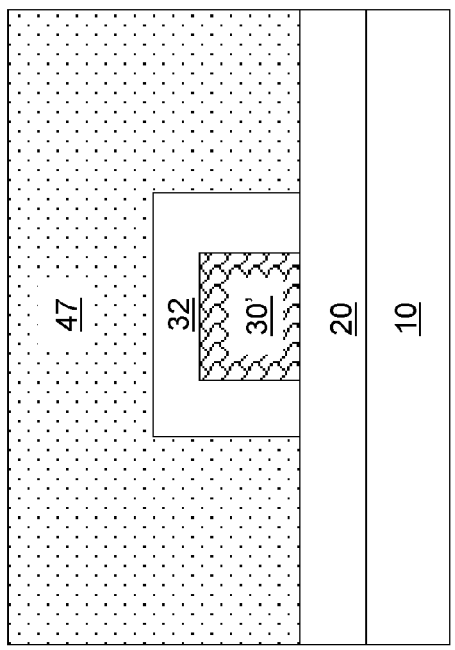
Figure 5C:
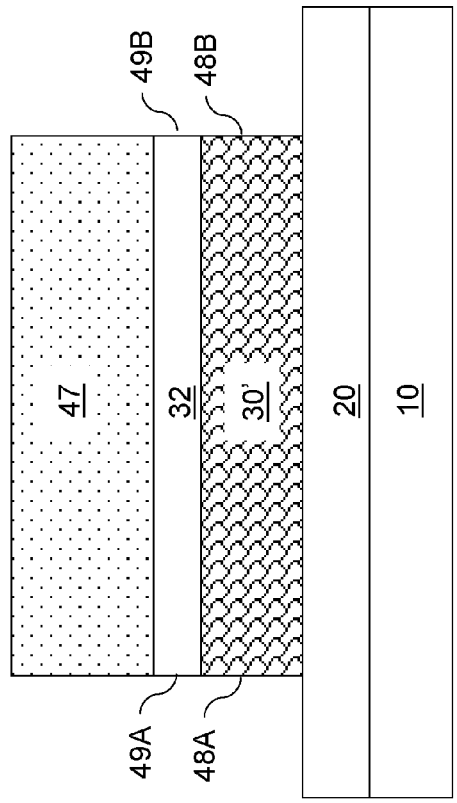

Referring to FIGS. 5A-5C, a first photoresist 47 is applied over the first exemplary semiconductor structure and lithographically patterned to expose end portions of the prototypical epitaxial semiconductor structure 32P. The edges of the first photoresist 47 after patterning overlie the porous silicon portion 30'. An anisotropic etch is performed employing the first photoresist 47 as an etch mask, and exposed portions of the prototypical epitaxial semiconductor structure 32P and the porous silicon portion 30' are removed. Preferably, but not necessarily, the anisotropic etch is selective to the insulator layer 20. The anisotropic etch may be a reactive ion etch. Etch chemistries that etch silicon selective to an insulator material such as silicon nitride or silicon oxide is known in the art. A first porous silicon portion end wall 48A and a second porous silicon portion end wall 48B are exposed by the anisotropic etch. The remaining portion of the prototypical epitaxial semiconductor structure 32P constitutes an epitaxial semiconductor structure 32. The exposed end walls of the epitaxial semiconductor structure 32 comprise a first epitaxial semiconductor end wall 49A and a second epitaxial semiconductor end wall 49B. The first photoresist 47 is subsequently removed.

Figure 6A:
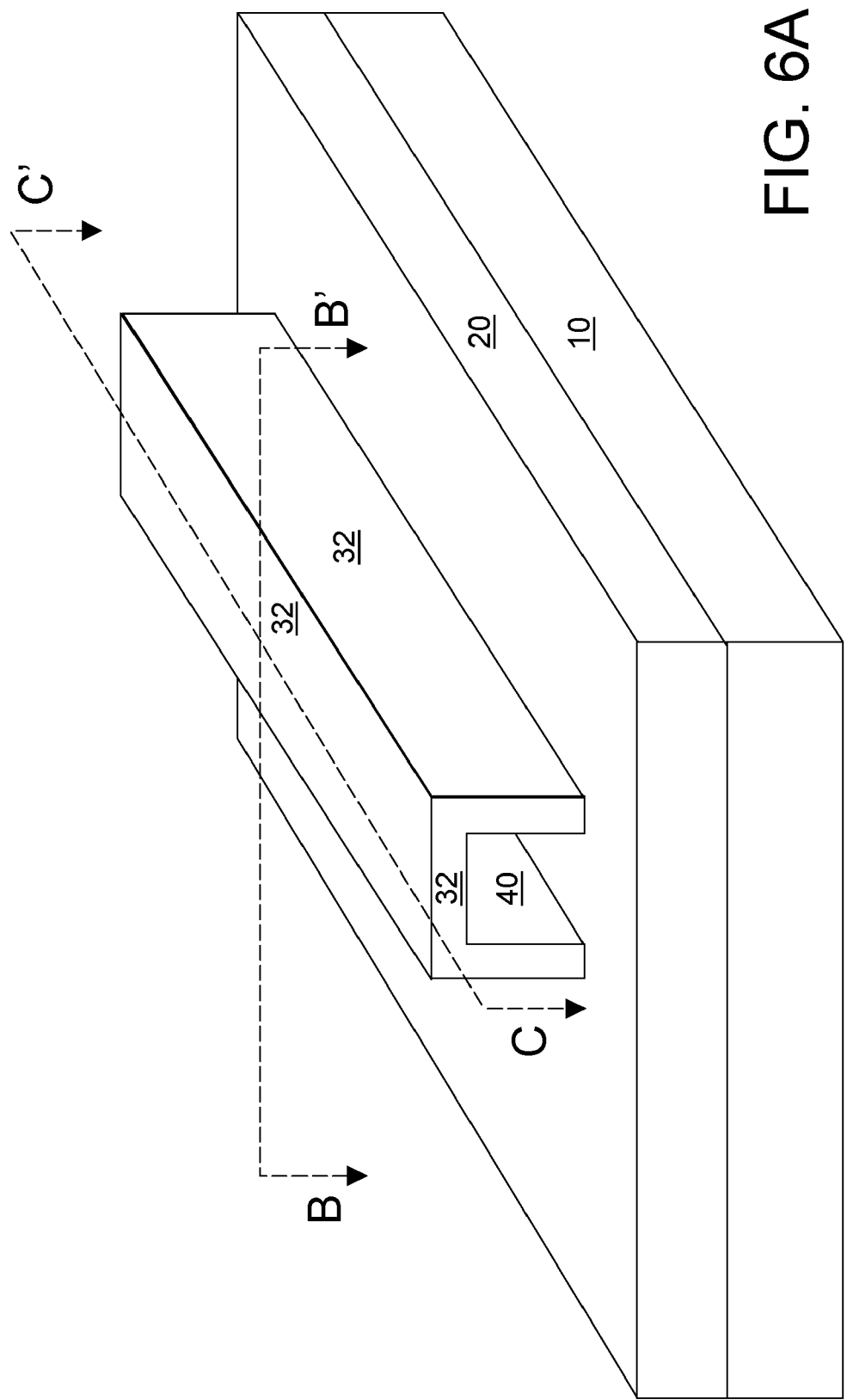

Referring to FIGS. 6A-6C, the porous silicon portion 30' is removed selective to the epitaxial semiconductor structure 32. The etch rate of the porous silicon portion 30' is higher, typically by orders of magnitude, than the etch rate of the epitaxial semiconductor structure 32 due to the presence of high density of pores in the porous silicon portion 30'. The first porous silicon portion end wall 48A and the second porous silicon portion end wall 48B provide entry points for etchants that remove the porous silicon portion 30' relative to the epitaxial semiconductor structure 32. Once the entirety of the porous silicon portion 30' is removed, a cavity C is formed within the enclosure of the epitaxial semiconductor structure 32 and the insulator layer 20.

The epitaxial semiconductor structure 32 comprises the horizontal layer 32H, the first vertical layer 32A, and the second vertical layer 32B. The horizontal layer 32H is separated from the insulator layer 20 by the cavity C, the first vertical layer 32A, and the second vertical layer 32B. The entirety of the epitaxial semiconductor structure 32 is single crystalline.

Figure 7A:
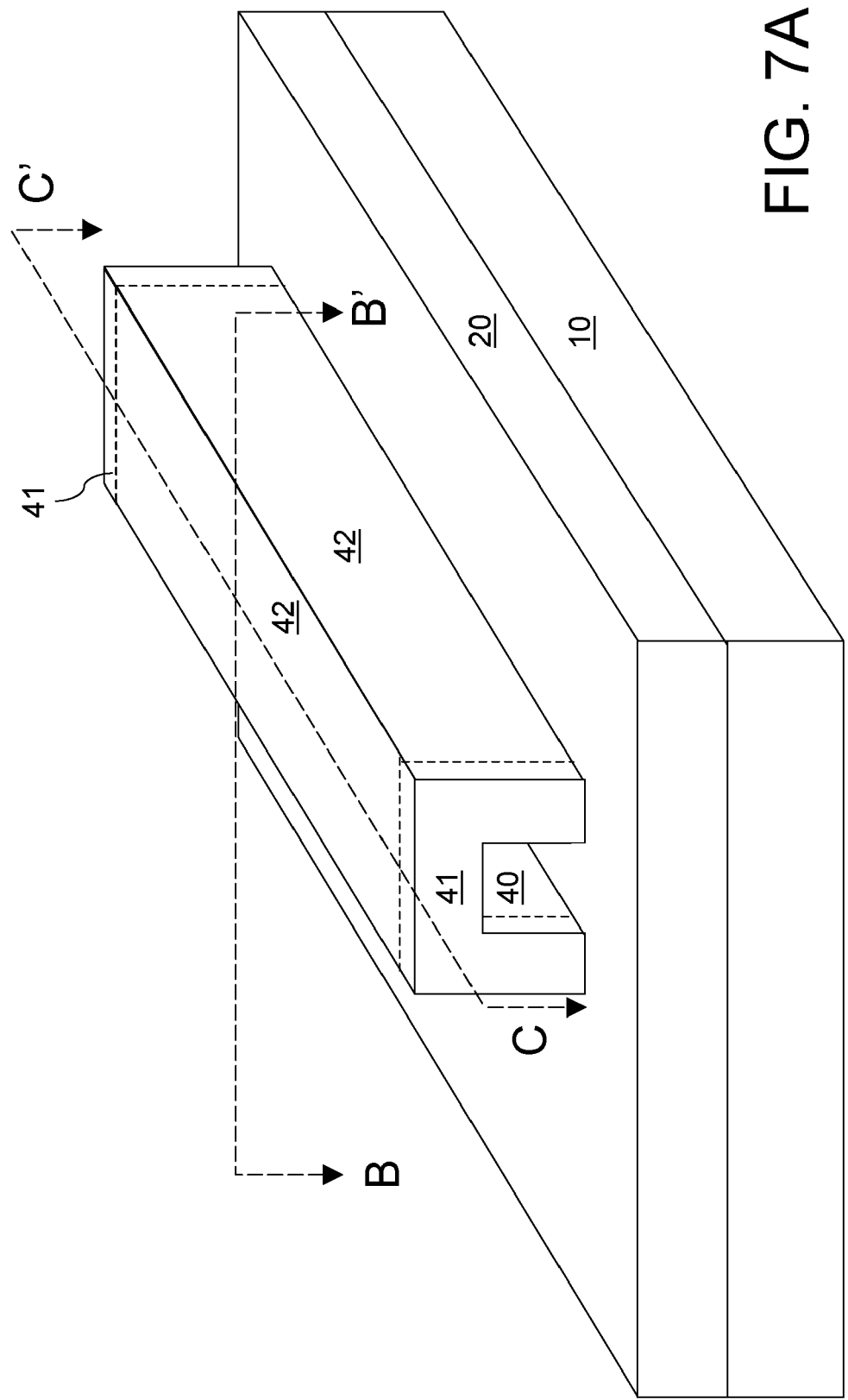
Figure 7B:
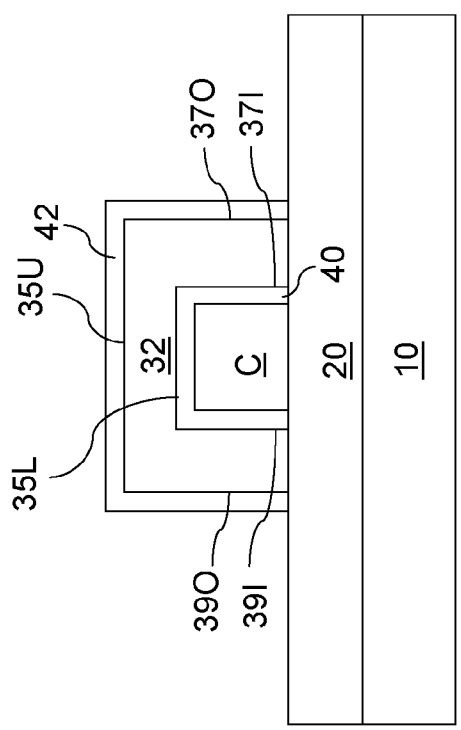
Figure 7C:
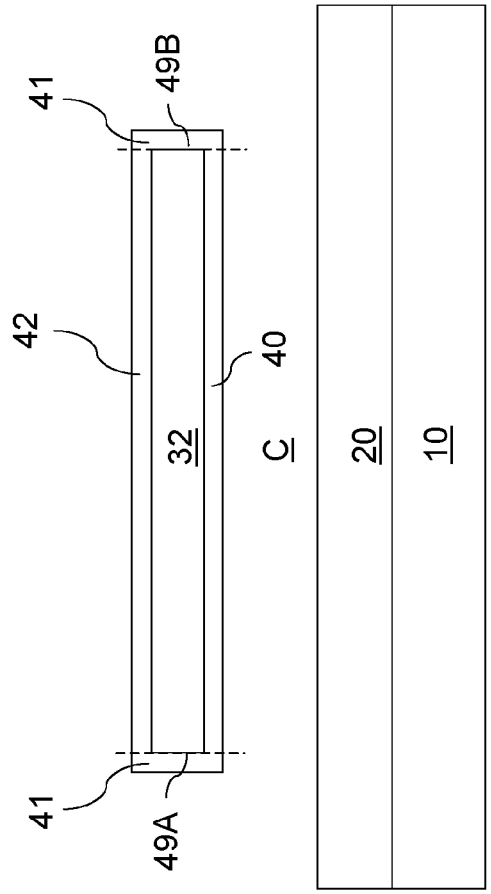

Referring to FIGS. 7A-7C, a gate dielectric layer is formed on the surfaces of the epitaxial semiconductor structure 32. The gate dielectric layer comprises an inner gate dielectric 40, an outer gate dielectric 42, and end wall gate dielectrics 41. The inner gate dielectric 40 abuts the epitaxial semiconductor lower surface 35L and the first and second vertical inner walls (37I, 39I). The outer gate dielectric 42 abuts the epitaxial semiconductor upper surface 35L and the first and second vertical outer walls (37O, 39O). The end wall gate dielectrics 41 abut the first epitaxial semiconductor end wall 49A and the second epitaxial semiconductor end wall 49B. The gate dielectric layer (40, 41, 42) and the insulator layer 20 encapsulate the epitaxial semiconductor structure 32. The thickness of the gate dielectric layer (40, 41, 42) may be from about 1 nm to about 10 nm, and preferably from about 1.5 nm to about 3 nm. The gate dielectric layer (40, 41, 42) may have an effective oxide thickness (EOT) on the order of, or less than, 1 nm.

The gate dielectric layer (40, 41, 42) may comprise a silicon oxide based dielectric material, such as silicon oxide or silicon oxynitride. In this case, the gate dielectric layer (40, 41, 42) may be formed by thermal oxidation and/or thermal nitridation, and is formed only on semiconductor surfaces, i.e., on the surfaces of the epitaxial semiconductor structure 32.

Alternately, the gate dielectric layer (40, 41, 42) may comprise a high dielectric constant (high-k) material comprising a dielectric metal oxide and having a dielectric constant that is greater than the dielectric constant of silicon nitride of 7.5. The dielectric metal oxide comprises a metal and oxygen, and optionally nitrogen and/or silicon. Exemplary high-k dielectric materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from about 0.5 to about 3 and each value of y is independently from 0 to about 2.

In this case, the gate dielectric layer (40, 41, 42) may be formed by one of deposition methods known in the art including, for example, chemical vapor deposition (CVD), atomic layer deposition (ALD), liquid source misted chemical deposition (LSMCD), etc. If the gate dielectric layer (40, 41, 42) is formed by deposition, another dielectric layer (not shown), which is contiguous with the gate dielectric layer (40, 41, 42) and has the same composition as the gate dielectric layer (40, 41, 42), is formed on all surfaces of the insulator layer 20.

Figure 8A:
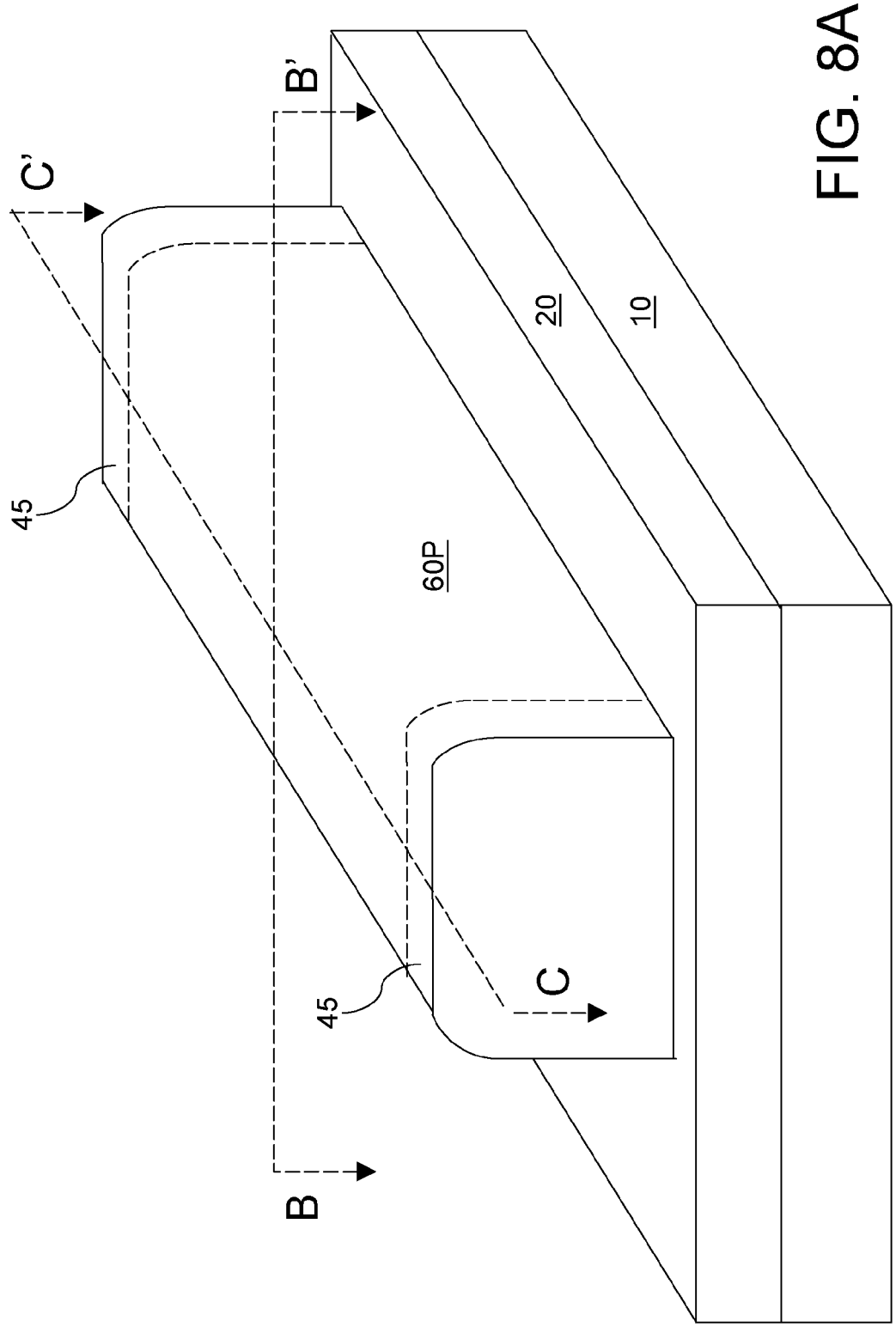
Figure 8B:
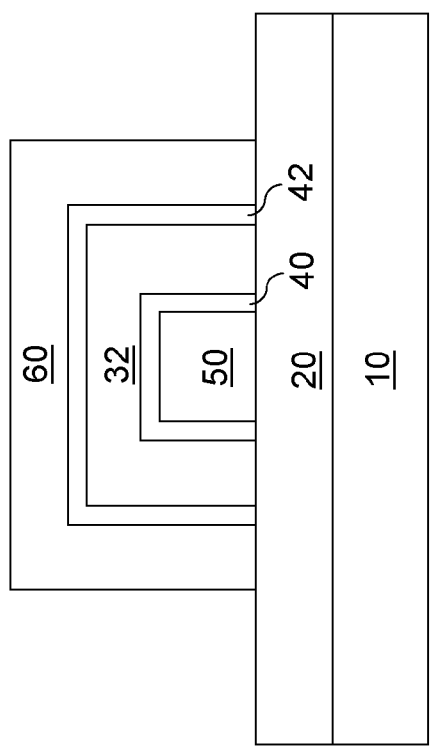
Figure 8C:
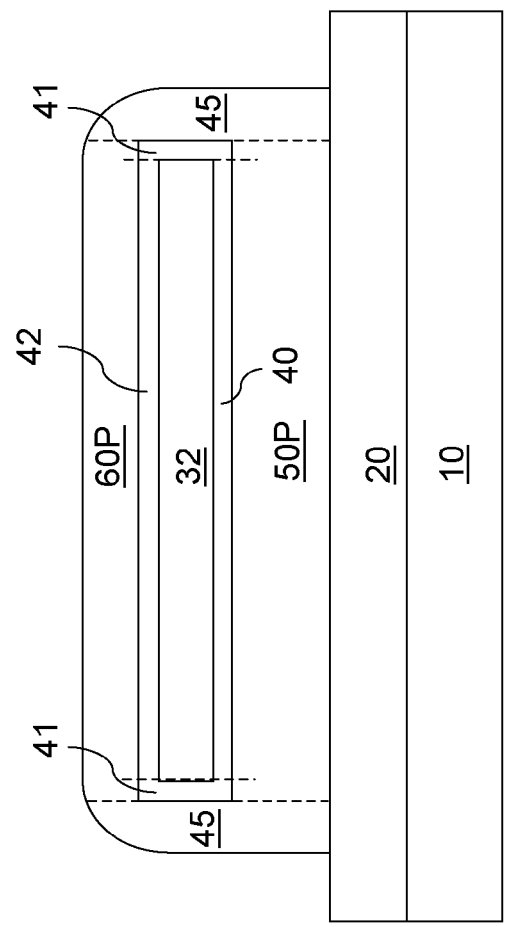

Referring to FIGS. 8A-8C, a gate electrode layer comprising a conductive material is formed on the gate dielectric layer (40, 41, 42) and the insulator layer 20, for example, by low pressure chemical vapor deposition (LPCVD), rapid thermal chemical vapor deposition (RTCVD), atomic layer deposition (ALD), etc. The conductive material may be a semiconductor, a metal, or a conductive metal alloy. For example, the conductive material may be doped polysilicon, a doped silicon-containing alloy, Zr, W, Ta, Hf, Ti, Al, a metal carbide, a transition metal aluminide, Ru, Pd, Pt, Co, Ni, $Ta_xAl_yN$, $W_xC_yN$, a conductive metal oxide, a conductive metal nitride, or a combination thereof. Each value of x is independently from 0 to about 2 and each value of y is independently from 0 to about 2. Preferably, the thickness of the gate electrode layer is selected to effect a complete filling of the cavity C.

The gate electrode layer comprises an outer gate electrode portion 60P, an inner gate electrode portion 50P, and end wall gate electrode portions 45, which are integrally formed as a single piece. The gate electrode layer (50P, 60P, 45) and the insulator layer 20 encapsulate the epitaxial semiconductor structure 32. The volume of the cavity C is filled with the inner gate electrode portion 50P.

Figure 9A:
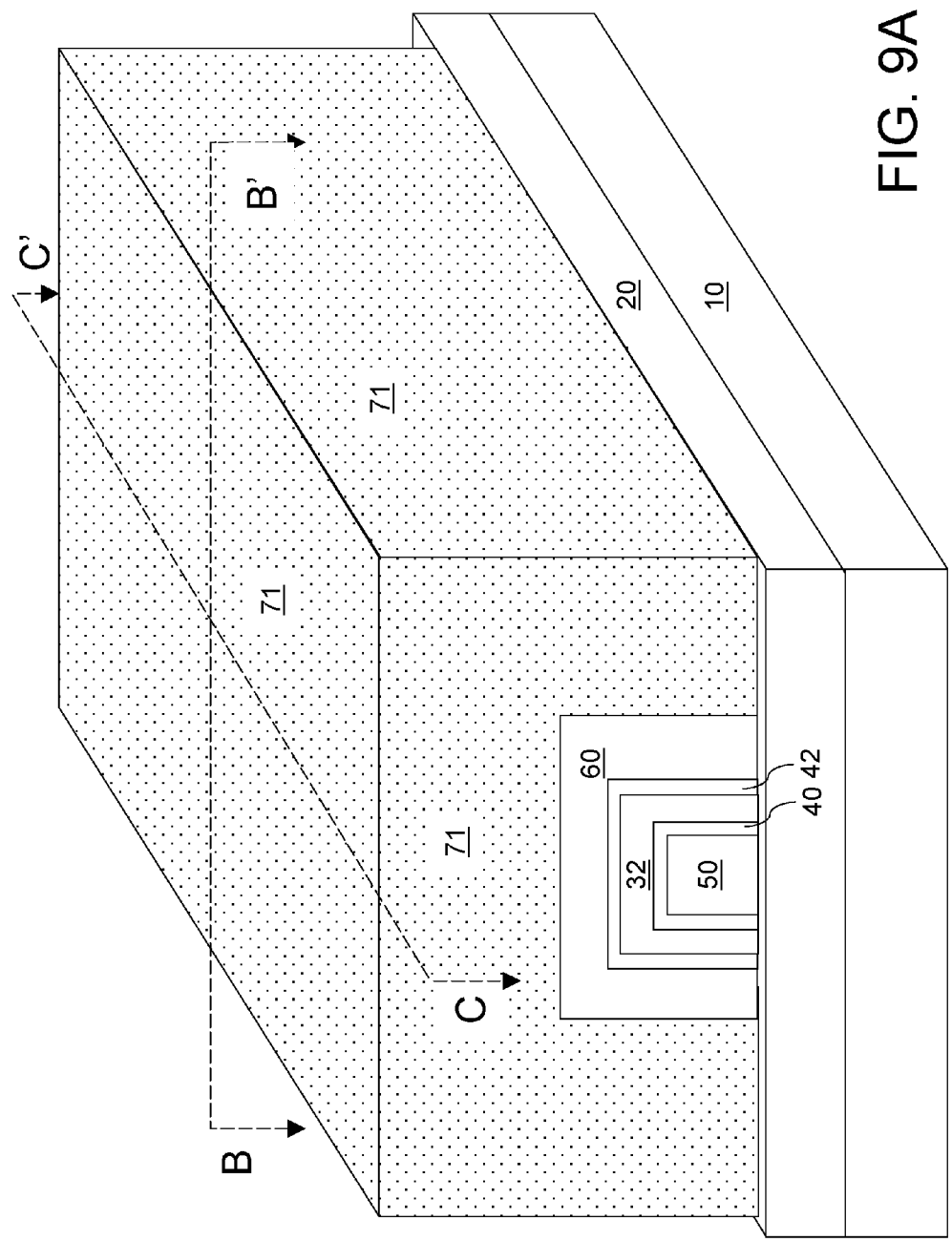
Figure 9C:
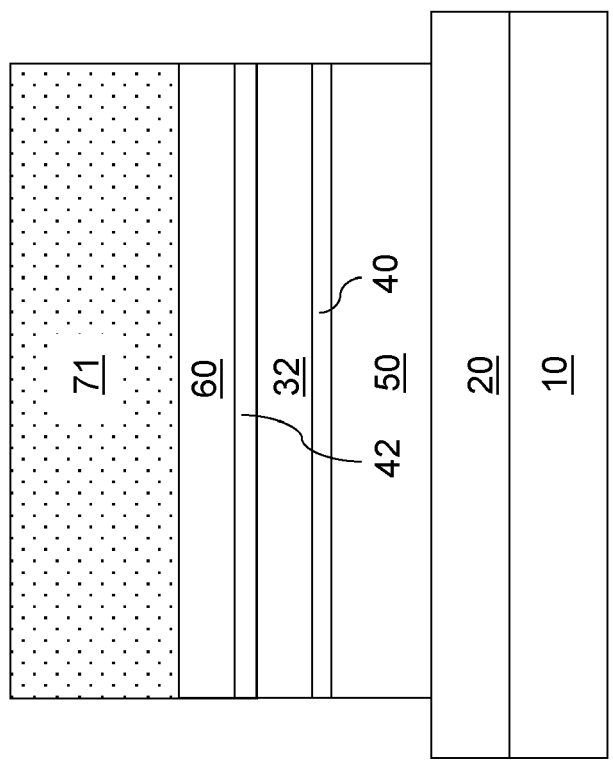
Figure 9B:
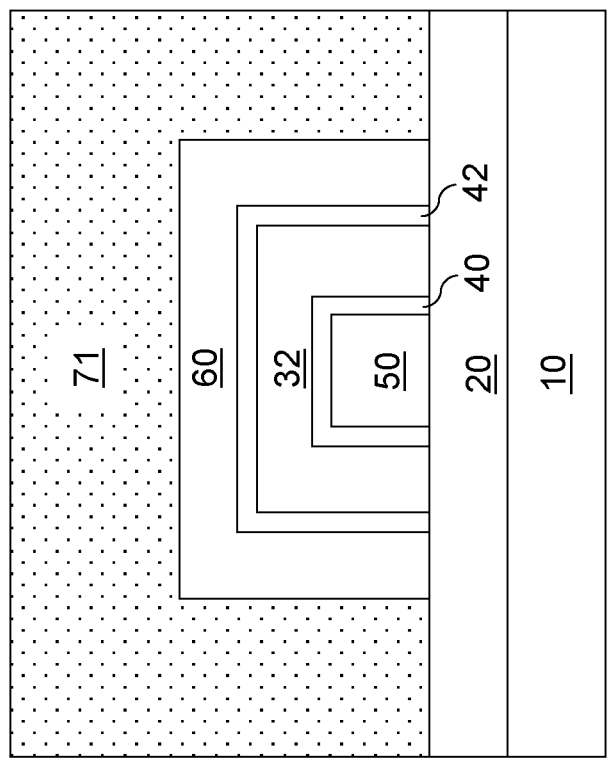

Referring to FIGS. 9A-9C, a second photoresist 71 is applied over the first exemplary semiconductor structure and lithographically patterned to expose end portions of the epitaxial semiconductor structure 32. The edges of the second photoresist 71 after patterning overlie the epitaxial semiconductor structure 32. An anisotropic etch is performed employing the second photoresist 71 as an etch mask, and exposed portions of the outer gate electrode portion 60P, the outer gate dielectric 42, the epitaxial semiconductor structure 32, the inner gate dielectric 40, and the inner gate electrode portion 50P are removed. Other structures lying outside the area covered by the second photoresist 71 and located above the insulator layer 20 are also removed, which include the end wall gate electrode portions 45 and the end wall gate dielectrics 41. Preferably, but not necessarily, the anisotropic etch is selective to the insulator layer 20. The anisotropic etch may be a reactive ion etch.

The remaining portion of the outer gate electrode portion 60P forms an outer gate electrode 60. The outer gate dielectric 42, the epitaxial semiconductor structure 32, and the inner gate dielectric 42 are shortened to the length corresponding to the length of the second photoresist 71 in a lengthwise direction. The remaining portion of the inner gate electrode portion 50P forms an inner gate electrode 50. At this step, the outer gate electrode 60, the outer gate dielectric 42, the epitaxial semiconductor structure 32, the inner gate dielectric 40, and the inner gate electrode 50 have coincident substantially vertical end walls and have substantially the same length. The second photoresist 71 is subsequently removed.

Figure 10A:
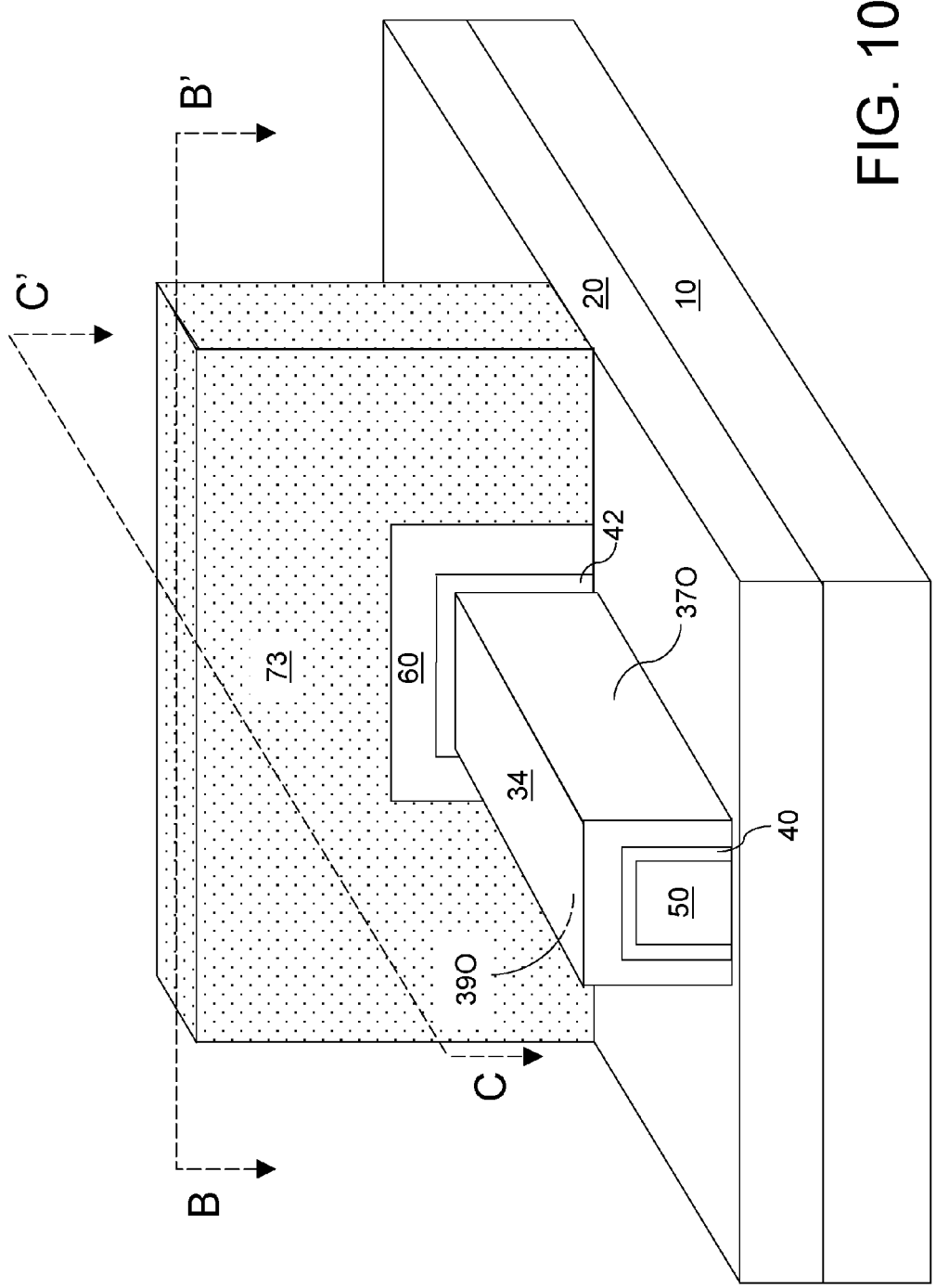
Figure 10C:
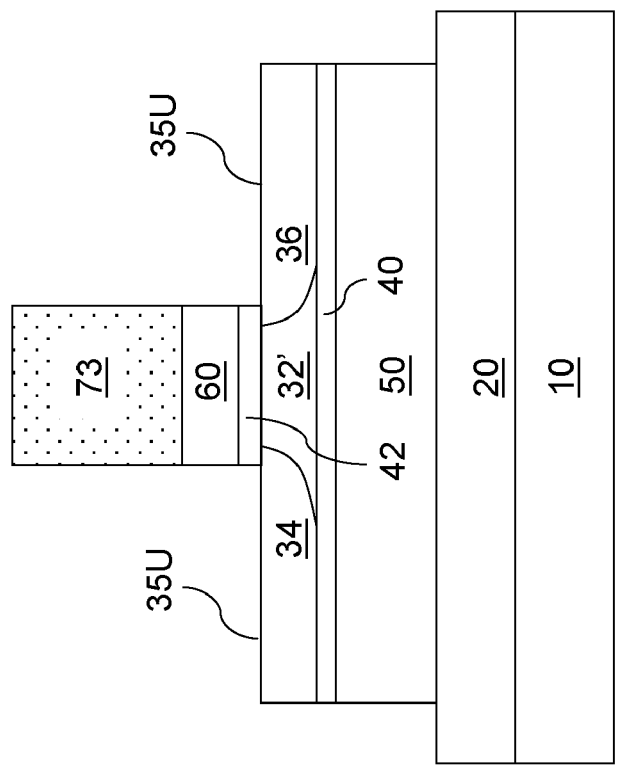
Figure 10B:
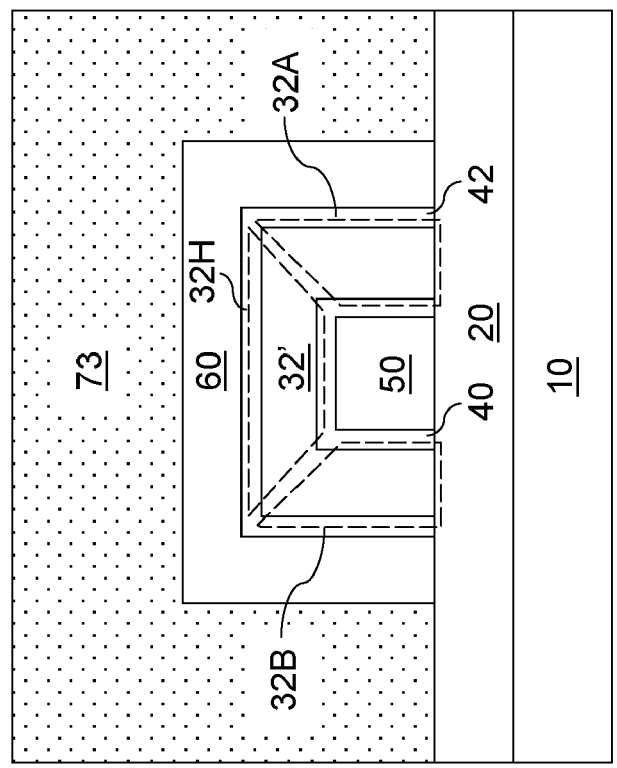

Referring to FIGS. 10A-10C, a third photoresist 73 is applied over the outer gate electrode 60 and lithographically patterned to cover a center portion of the outer gate electrode 60 spanning the epitaxial semiconductor structure 32 in a widthwise direction, i.e., in the direction perpendicular to the lengthwise direction. Another anisotropic etch is performed employing the third photoresist 73 as an etch mask, and exposed portions of the outer gate electrode 60 outside the area covered by the third photoresist 73 are removed. Preferably, the anisotropic etch is selective to the outer gate dielectric 42 and the insulator layer 20. The extent of the outer gate electrode 60 is reduced to the portion within the area covered by the third photoresist 73.

In a variation of the first embodiment, the lithographic steps employing the second photoresist 71 and the third photoresist 73 may be combined in one lithographic step.

The exposed portions of the outer gate dielectric 42 outside the area covered by the third photoresist 73 are thereafter removed by an etch, which may be an isotropic etch or an anisotropic etch. Preferably, the etch is selective to the epitaxial semiconductor structure 32 (See FIGS. 9A-9C). Portions of the silicon upper surface 35U, the first vertical outer wall 37O, and the second vertical outer wall 39O located outside the area of the third photoresist 73 are exposed after the etch.

Dopants of a second conductivity type, which is the opposite of the first conductivity type, are then implanted into the exposed portions of the epitaxial semiconductor structure 32 through the silicon upper surface 35U, the first vertical outer wall 37O, and the second vertical outer wall 39O to form a source region 34 and the drain region 36. Angled ion implantations may be employed to deliver dopants uniformly within the source region 34 and the drain region 36. The dopant concentration of the source region 34 and the drain region 36 may be from about $1.0\times10^{19}/cm^3$ to about $1.0\times10^{21}/cm^3$, and preferably from about $1.0\times10^{20}/cm^3$ to about $5.0\times10^{20}/cm^3$, although lesser and greater dopant concentrations are explicitly contemplated herein. The remaining portion of the epitaxial semiconductor structure 32, which has a doping of the first conductivity type, constitutes a body region 32'. Each of the source region 34 and the drain region 36 includes a portion of the horizontal layer 32H, a portion of the first vertical layer 32A, and a portion of the second vertical layer 32B. The third photoresist 73 is subsequently removed. Other structures (not shown) such as spacers, halo, and source/drain extension, can be formed before or after forming the source region 34 and the drain region 36.

Figure 11A:
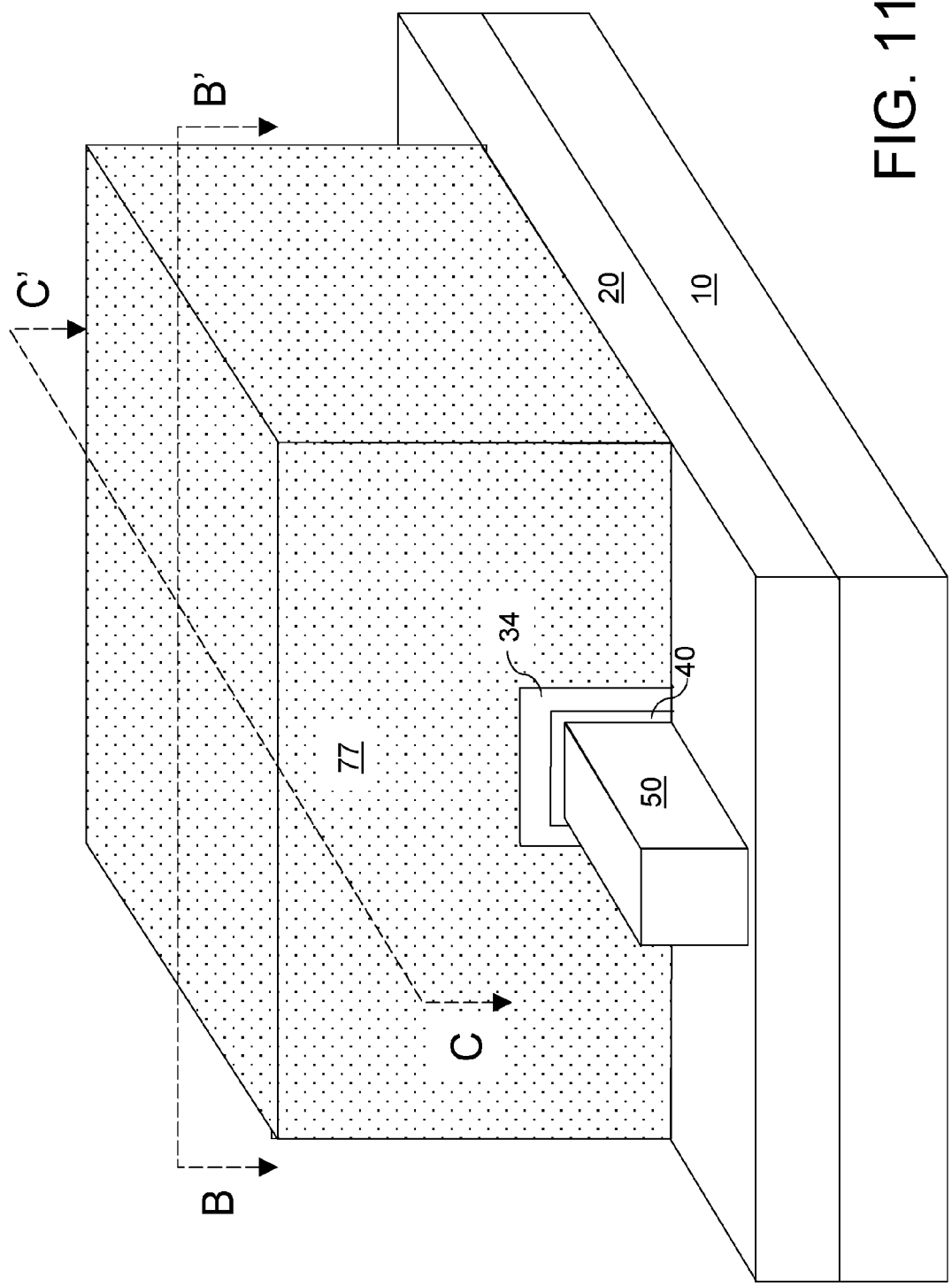
Figure 11C:
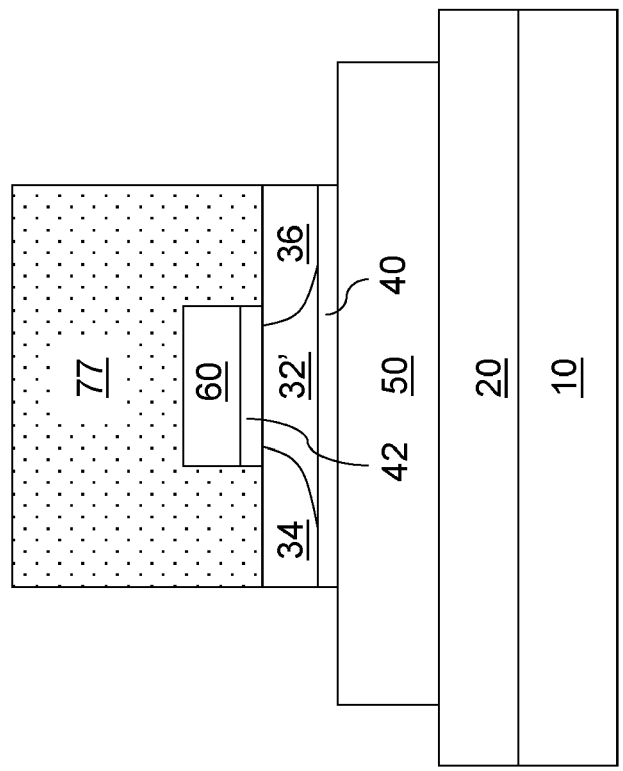
Figure 11B:
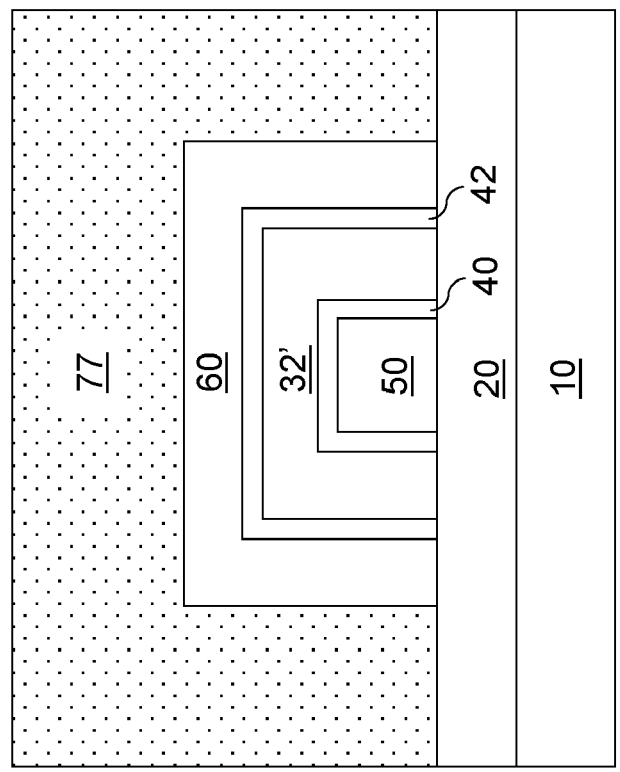

Referring to FIGS. 11A-11C, a fourth photoresist 77 is applied over the first exemplary semiconductor structure and lithographically patterned to cover a portion of the source region 34 and a portion of the drain region 36. The area of the fourth photoresist 77 that overlaps the epitaxial semiconductor structure (32', 34, 36) includes all of the area of the third photoresist 73 that overlaps the epitaxial semiconductor structure (32', 34, 36). An anisotropic etch is performed employing the fourth photoresist 77 as an etch mask, and exposed portions of the source region 34 and the drain region 36 outside the area covered by the fourth photoresist 77 are removed. Preferably, the anisotropic etch is selective to the inner gate dielectric 40 and the insulator layer 20. The extent of the source region 34 and the drain region 36 is reduced to the portion within the area covered by the fourth photoresist 77. Alternatively, instead of using the fourth photoresist 77, the reduction of the source region 34 and the region 36 can be achieved by forming spacers surrounding the outer gate electrode 60.

The exposed portions of the inner gate dielectric 40 outside the area covered by the fourth photoresist 77 are thereafter removed by an etch, which may be an isotropic etch or an anisotropic etch. Preferably, the etch is selective to the inner gate electrode 50. An upper surface and vertical sidewalls of the inner gate electrode 50 are exposed outside the area covered by the fourth photoresist 77. The fourth photoresist 77 is subsequently removed.

Figure 12A:
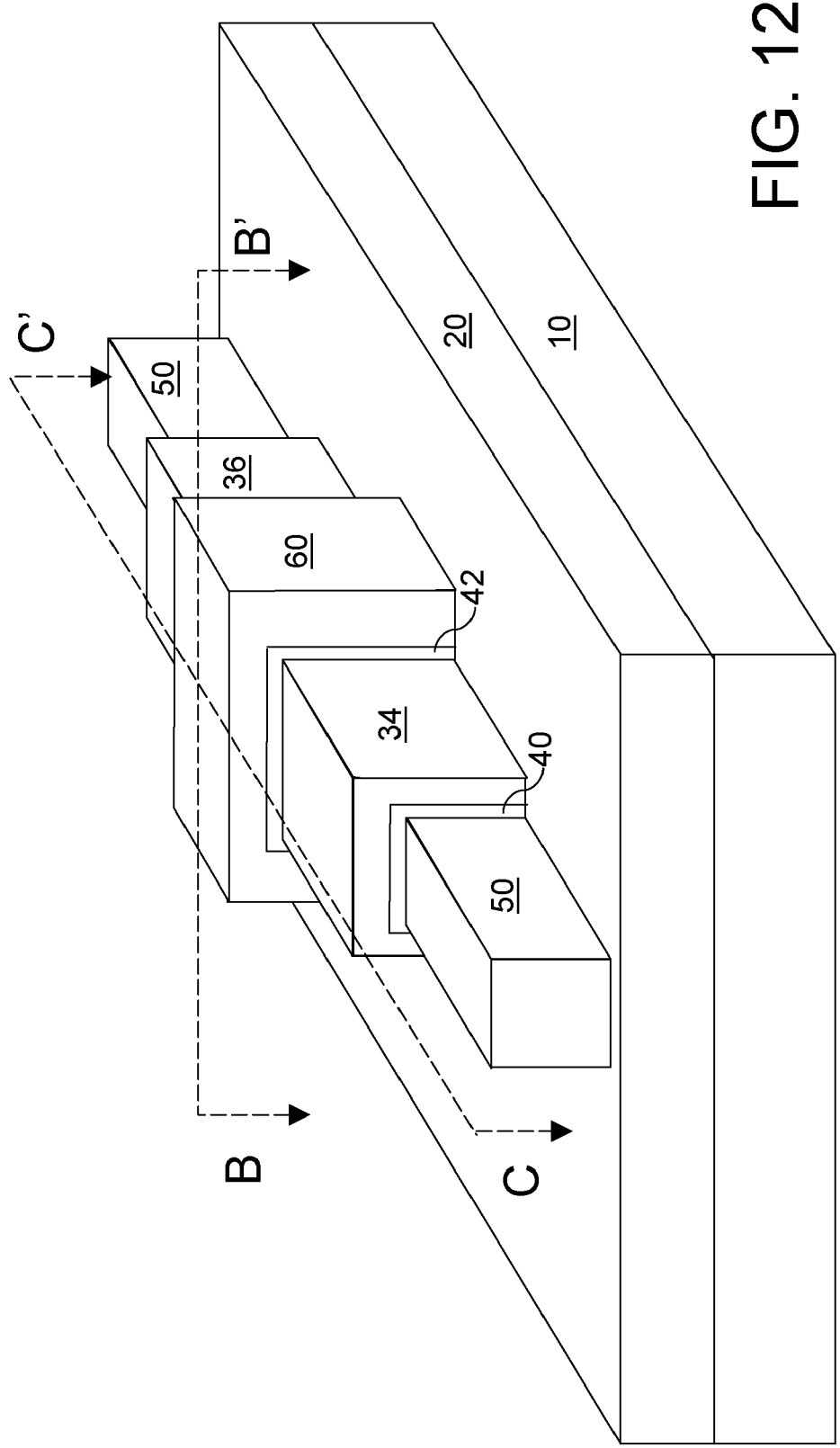
Figure 12C:
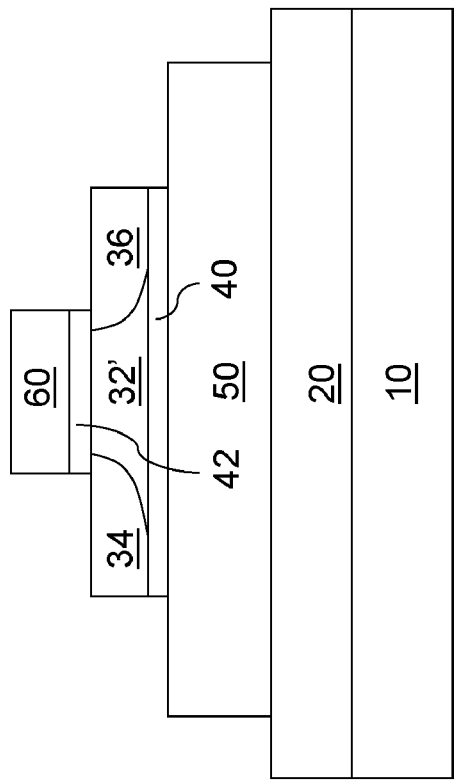
Figure 12B:
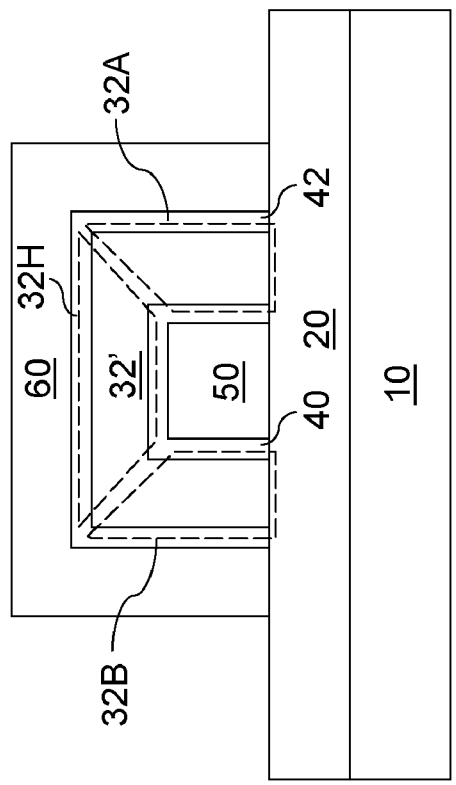

Referring to FIGS. 12A-12C, the first exemplary semiconductor structure of the present invention comprises:

a substrate (10, 20) including an insulator layer 20;

an epitaxial semiconductor structure (32', 34, 36) including a horizontal layer 32H separated from the insulator layer 20, a first vertical layer 32A vertically abutting the insulating layer 20, a second vertical layer 32B abutting the insulating layer 20 and not abutting the first vertical layer 32A;

an inner gate electrode 50 insulated from the epitaxial semiconductor structure (32', 34, 36) and located between the first and second vertical layers (32A, 32B) and between the horizontal layer 32H and the insulating layer 20;

an outer gate electrode 60 insulated from the epitaxial semiconductor structure (32', 34, 36) located over the epitaxial semiconductor structure (32', 34, 36);

a body region 32' located in the epitaxial semiconductor structure (32', 34, 36) and having a doping of a first conductivity type;

a source region 34 having a doping of a second conductivity type and located at a first end of the epitaxial semiconductor structure (32', 34, 36), wherein the second conductivity type is the opposite of the first conductivity type;

a drain region 36 having a doping of the second conductivity type and located at a second end of the epitaxial semiconductor structure (32', 34, 36) and separated from the source region 34.

an inner gate dielectric 40 abutting the inner gate electrode 50 and the epitaxial semiconductor structure (32', 34, 36); and an outer gate dielectric 42 abutting the outer gate electrode 60 and the epitaxial semiconductor structure (32', 34, 36).

The source region 34 protrudes out of a first end surface of the outer gate electrode 60, the drain region 36 protrudes out of a second end surface of the outer gate electrode 60, and the inner gate electrode 50 protrudes out of at least one end surface of the epitaxial semiconductor structure (32', 34, 36). The first exemplary semiconductor structure may further comprise other structures, including but not limited to, spacers, source/drain extensions, etc. Such structures are omitted in figures for clarity.

Figure 13A:
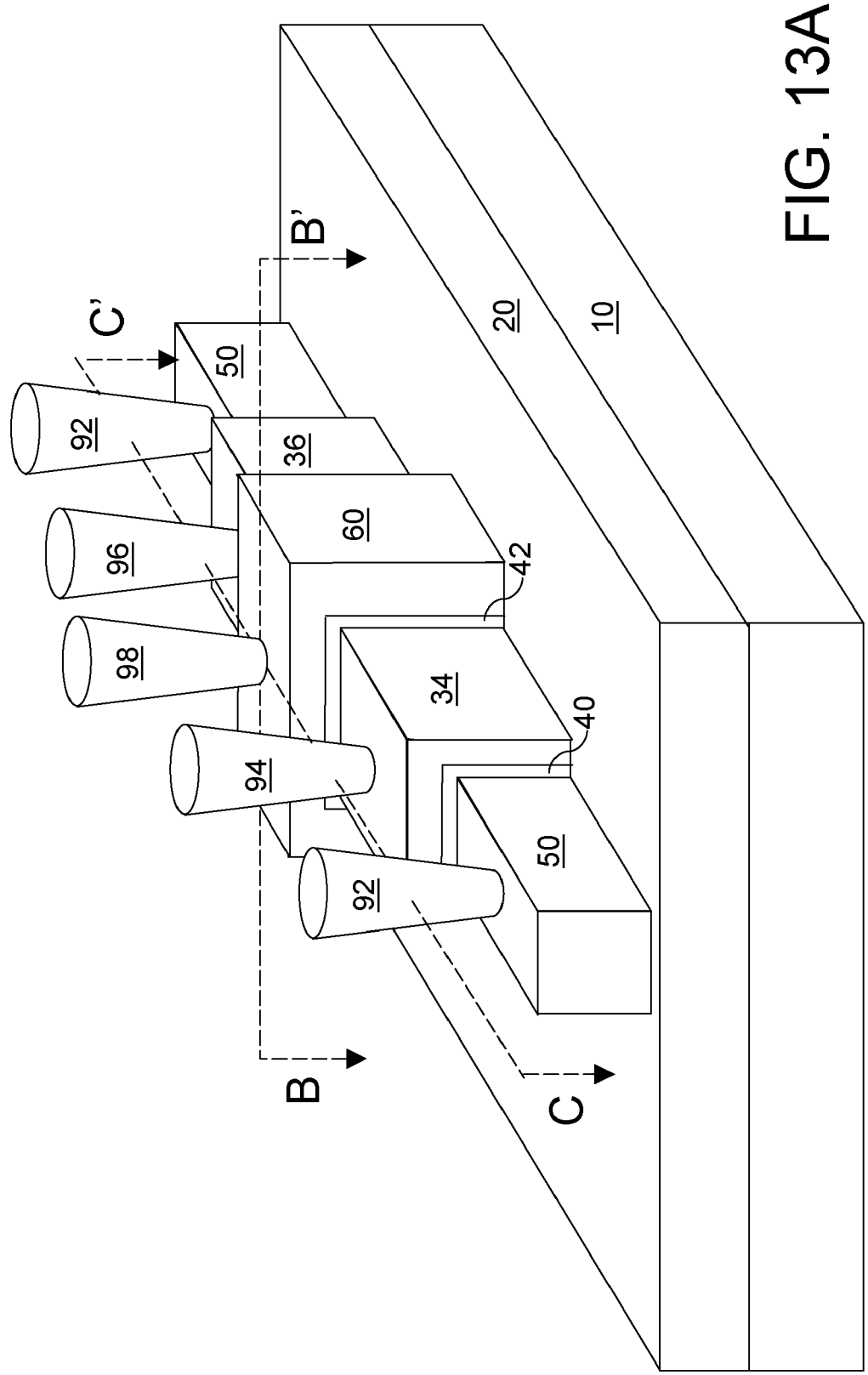

Referring to FIGS. 13A-13C, a dielectric material layer 80 (shown in FIGS. 13B and 13C and omitted in FIG. 13A for clarity) is formed over the outer gate electrode 60, the source region 32, the drain region 36, the inner gate electrode 50, and the insulation layer 20. The dielectric material layer 80 may, or may not, include a mobile ion barrier layer (not shown), which typically comprises silicon nitride. The dielectric material layer 80 may, or may not, include a stress film, such as tensile or compressive silicon nitride, to enhance device performance. The dielectric material layer 80 may comprise, for example, a CVD oxide such as undoped silicate glass (USG), borosilicate glass (BSG), phosphosilicate glass (PSG), fluorosilicate glass (FSG), borophosphosilicate glass (BPSG), or a combination thereof. Alternately, the dielectric material layer 80 may comprise a low-k dielectric material having a dielectric constant less than 3.9 (the dielectric constant of silicon oxide), and preferably less than about 2.5. Exemplary low-k dielectric materials include organosilicate glass (OSG) and SiLK™.

Typically, various contact via holes (not shown) are formed in the dielectric material layer 80 and filled with metal to from various contact vias. Specifically, the various contact vias include a source side contact via 94 abutting the source region 34, a drain side contact via 96 abutting the drain region 36, an outer gate contact via 98 abutting the outer gate electrode 60, and at least one inner gate contact via 92 abutting the inner gate electrode 50.

In an application of the present invention, one of the inner gate electrode 50 and the outer gate electrode 60 operates as a normal gate electrode controlling the flow of current between the source region 34 and the drain region 36, while the other of the inner gate electrode 50 and the outer gate electrode 60 operates as a back gate electrode that applies an electrical bias having the same polarity relative to the source region 34 as the electrode that operates as the normal gate electrode. In this mode of operation, inversion layers may be induced underneath both the inner gate electrode 50 and the outer gate electrode 60 so that floating body effect is reduced and the control of the channel for the current flow is more tightly controlled compared with a single gate transistor.

In another application of the present invention, the inner gate electrode 50 and the outer gate electrode 60 are operated with voltages of opposite polarity relative to the source region 34 of the epitaxial semiconductor structure (32', 34, 36), which has a semitubular configuration, to induce an inversion layer on one side and an accumulation layer on the other side body region 32'. The inversion layer attracts minority carriers in a channel. Since the body region 32' has a doping of the first conductivity type, an inversion layer attracts charge carriers of the second conductivity type. In contrast, the accumulation layer attracts majority carriers, i.e., charge carriers of the first conductivity type. For example, if the first conductivity type is p-type, the inversion layer attracts electrons to enable current flow between the source region 34 and the drain region 36, while the accumulation layer attracts holes. If the first conductivity type is n-type, the inversion layer attracts holes to enable current flow between the source region 34 and the drain region 36, while the accumulation layer attracts electrons.

In one exemplary operational mode, an inversion layer is formed in the first channel located on the outer sidewalls and the upper surface of the body region 32' inside, or underneath, the outer electrode 60, while an accumulation layer is formed in the second channel located on the inner sidewalls and a bottom surface of a horizontal portion of the body region 32' outside, or over, the inner electrode 50. In another exemplary operational mode, an accumulation layer is formed in the first channel located on the outer sidewalls and the upper surface of the body region 32' inside, or underneath, the outer electrode 60, while an inversion layer is formed in the second channel located on the inner sidewalls and a bottom surface of a horizontal portion of the body region 32' outside, or over, the inner electrode 50.

In both exemplary operational modes, the majority charge that accumulates in the accumulation layer is stored within the body region 32' even after the source region 34 electrically floating or grounded. The operational conditions of the transistor may be selected to alter the amount of charge stored in the body region 32'. The quantity of charge stored in the body region 32' may be used to store information, i.e., a "0" state or a "1" state. The charge stored in the body region 32' may be read periodically and recharged as necessary to refresh the information stored in the body region 32' so that the transistor may be operated as a dynamic memory device. In this case, the body region 32' of the epitaxial semiconductor structure (32', 34, 26) constitutes a charge storage node. The body region 32' is a quasi-neutral floating body.

When the transistor is operated as a memory device, the body region 32' may be an electrically quasi-neutral floating-body. Depending on whether excess charges are stored in the body region 32', a logic state of "0" or "1" is stored. The write operation—the operation to generate or remove charges in the body region 32' can be achieved as follows. To store a logic state of "1", impact ionization or gate-induced-drain-leakage to generate excess charges in the body region 32'. To store a logic state of "0", a forward bias can be applied to the drain to body diode to remove charges in the body region 32'. Those excess charges alter transistor characteristics such as threshold voltage. In one exemplary embodiment, the inner gate and the outer gate are biased at different voltages. The inner gate is biased at a constant voltage such that helps improve the performance of the memory device while the outer gate voltage varies depending on read, write, or refreshing operations. For example, in the case that the transistor is an n-type transistor, the inner gate can be biased at a voltage ranging from about −5 volts to −0.5 volts, and more preferably from −1.5 volts to −1 volts. The outer gate bias varies from 0 volts to 1 volts.

Referring to FIGS. 14A and 14B, a second exemplary semiconductor structure according to a second embodiment of the present invention is derived from the first exemplary semiconductor structure of FIGS. 3A-3C by forming a silicon-germanium alloy layer 131 directly on the porous silicon portion 30'. The silicon-germanium alloy layer 131 is epitaxially deposited on exposed surfaces of the porous silicon portion 30'. To effect the deposition of the silicon-germanium alloy layer 131, the second exemplary semiconductor structure is placed in a reactor and a silicon-containing reactant gas and a germanium-containing reactant gas are flown into the reactor with a carrier gas such as $H_2$ or He. Exemplary silicon-containing reactant gases include $SiH_4$, $SiH_2Cl_2$, $SiHCl_3$, $SiCl_4$, $Si_2H_6$, etc., or a combination thereof. Exemplary germanium-containing reactant gases include $GeH_4$, $Ge_2H_6$, etc.

In an embodiment of the present invention, the epitaxial deposition of the silicon-germanium alloy layer 131 is performed selectively by flowing an etchant such as HCl into the reactor with the carrier gas and the reactant gases. Such an etchant makes the epitaxial deposition process selective so that the silicon-germanium alloy layer 131 grows only on the surfaces of the porous silicon portion 30', and no growth of any semiconductor material occurs on the surfaces of the insulator layer 20. Alternately, the epitaxial deposition may proceed non-selectively, and polycrystalline portions of a silicon-germanium alloy, which grows on the surfaces of the insulator layer 20 in this case, are subsequently removed by lithographic patterning, for example, at the processing steps corresponding to FIGS. 18A and 18B below.

The concentration and thickness of germanium in the silicon-germanium alloy layer 131 are selected so that an epitaxial registry is maintained throughout the growth of the silicon-germanium alloy layer 131, while lattice relaxation occurs in the silicon-germanium alloy layer 131 during the growth through dislocation formation and strain relaxation. The lattice constant of the silicon-germanium alloy layer 131 on outer surfaces, i.e., exposed surfaces, is different from the lattice constant of the silicon-germanium alloy layer 131 on inner surfaces, i.e., the interfaces with the porous silicon portion 30'. Thus, the lattice constant of the silicon-germanium alloy layer 131 on the outer surfaces is greater than the lattice constant of normal silicon in an unstrained state. The lattice constant of the silicon germanium alloy layer 131 at the interface with the porous silicon layer 30' may be substantially the same as the lattice constant of normal silicon without strain. The thickness of the silicon-germanium alloy layer 131 may be from about 5 nm to about 200 nm, and typically from about 10 nm to about 100 nm. The atomic percentage of germanium in the silicon-germanium alloy layer 131 may be from 0% to about 30%, and typically from about 1% to about 15%. The atomic concentration of germanium may be graded so that the atomic concentration of germanium increased with distance from the interface with the porous silicon portion 30'.

Figure 15A:
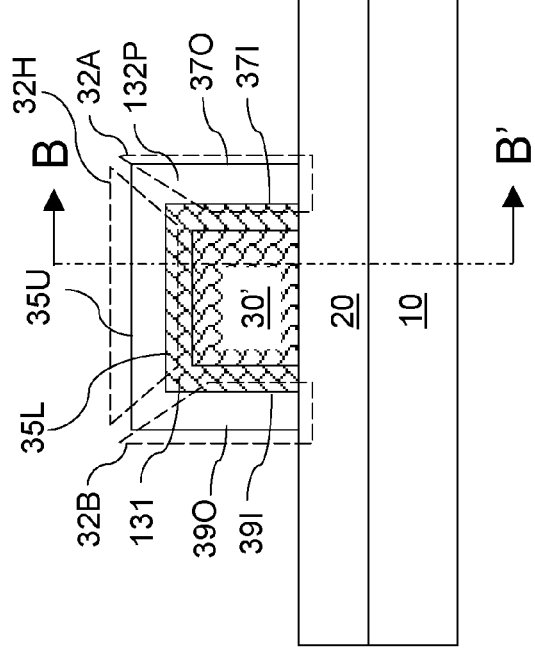
Figure 15B:
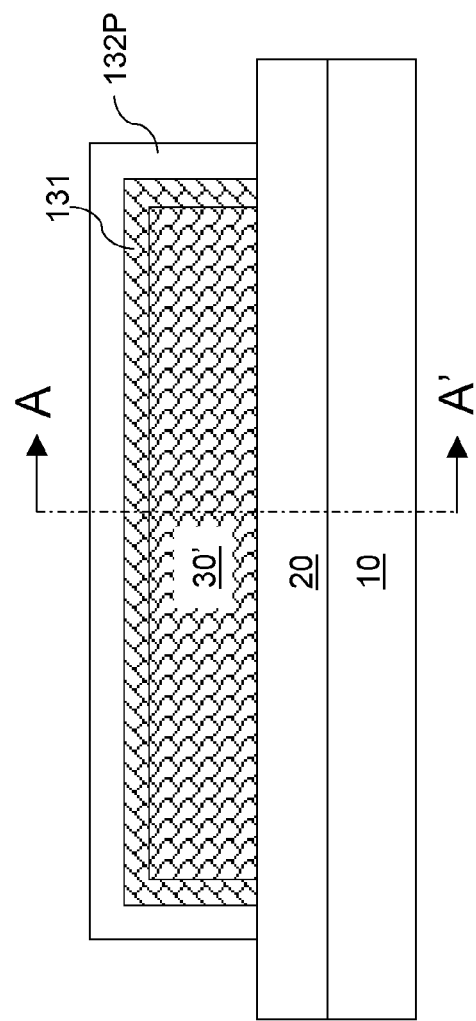

Referring to FIGS. 15A and 15B, a semiconductor material is epitaxially deposited on exposed surfaces of the silicon-germanium alloy layer 131 to form a prototypical strained epitaxial semiconductor structure 132P. The semiconductor material is deposited with a non-zero strain due to a mismatch between the lattice constant of the silicon germanium alloy layer 131 at the outer surface and the normal lattice constant of the semiconductor material. Since epitaxial registry is forced on the newly deposited silicon material, the prototypical strained epitaxial semiconductor structure 132P is necessarily strained.

The prototypical strained epitaxial semiconductor structure 132P may, or may not, consist of doped silicon or undoped silicon. In case the prototypical strained epitaxial semiconductor structure 132P comprises silicon, the second exemplary semiconductor structure is placed in a reactor and a silicon-containing reactant gas, which may be selected from SiH$_4$, SiH$_2$Cl$_2$, SiHCl$_3$, SiCl$_4$, Si$_2$H$_6$, etc., or a combination thereof, is flown into the reactor with a carrier gas such as H$_2$ or He to effect the deposition of the prototypical epitaxial semiconductor structure 132P. Deposition conditions described in the references incorporated above may be employed.

In an embodiment of the present invention, the epitaxial deposition of silicon is performed selectively by flowing an etchant such as HCl into the reactor with the carrier gas and the reactant gas. Such an etchant makes the epitaxial deposition process selective so that silicon grows only on the surfaces of the silicon-germanium alloy layer 131, and no growth of silicon occurs on the surfaces of the insulator layer 20. Alternately, the epitaxial deposition may proceed non-selectively, and polycrystalline portions of silicon, which grows on the surfaces of the insulator layer 20 in this case, are subsequently removed by lithographic patterning, for example, at the processing steps corresponding to FIGS. 18A and 18B below.

The prototypical strained epitaxial semiconductor structure 132P is structurally equivalent to the prototypical epitaxial semiconductor structure 32P of the first embodiment with the difference that a set of the silicon-germanium alloy layer 131 and the porous silicon portion 30' of the second exemplary semiconductor structure is structurally equivalent to the porous silicon portion 30' of the first exemplary semiconductor structure. Thus, the prototypical strained epitaxial semiconductor structure 132P comprises a horizontal layer 32H, a first vertical layer 32A, and a second vertical layer 32B as the prototypical epitaxial semiconductor structure 32P of the first embodiment. The horizontal layer 32H has an epitaxial semiconductor upper surface 35U and an epitaxial semiconductor lower surface 35L, and is separated from the insulator layer 20 by the silicon-germanium alloy layer 131 and the porous silicon portion 30', the first vertical layer 32A, and the second vertical layer 32B. The first vertical layer 32A has a first vertical inner wall 37I and a first vertical outer wall 37O, and the second vertical layer 32B has a second vertical inner wall 37I and a second vertical outer wall 39O. The entirety of the prototypical strained epitaxial semiconductor structure 132P, the silicon-germanium alloy layer 131, and the porous silicon portion 30' are single crystalline. The thickness of the prototypical strained epitaxial semiconductor structure 132P as measured on the horizontal layer may be from about 25 nm to about 500 nm, and typically from about 50 nm to about 250 nm, although lesser and greater thicknesses are also contemplated.

The effect of surface orientations of the various surfaces of the prototypical strained epitaxial semiconductor structure 132P is the same as discussed for the prototypical epitaxial semiconductor structure 32P above. Since there is a lattice mismatch between the prototypical strained epitaxial semiconductor structure 132P and the porous silicon portion 30', there is a non-zero strain in the prototypical strained epitaxial semiconductor structure 132P.

The prototypical strained epitaxial semiconductor structure 132P may be substantially undoped, doped with p-type dopants, or doped with n-type dopants as grown on the silicon-germanium alloy layer 131. Methods of doping and the dopant concentration of the prototypical strained epitaxial semiconductor structure 132P is the same as those of the prototypical epitaxial semiconductor structure 32P of the first embodiment. If the prototypical strained epitaxial semiconductor structure 132P is intrinsic as grown, the ion implantation may be performed at a subsequent processing step prior to formation of an outer electrode described below.

Referring to FIGS. 16A and 16B, an outer gate dielectric layer 142 is formed on the surfaces of the prototypical strained epitaxial semiconductor structure 132P. The gate dielectric layer 142 is formed on the epitaxial semiconductor upper surface 35U, the first vertical outer wall 37O, and the second vertical outer wall 39O. The outer gate dielectric layer 142 and the insulator layer 20 encapsulate the prototypical strained epitaxial semiconductor structure 132P. The thickness of the outer gate dielectric layer 142 may be from about 1 nm to about 10 nm, and preferably from about 1.5 nm to about 3 nm. The outer gate dielectric layer 142 may have an effective oxide thickness (EOT) on the order of, or less than, 1 nm.

The outer gate dielectric layer 142 may comprise a silicon oxide based dielectric material, such as silicon oxide or silicon oxynitride. In this case, the outer gate dielectric layer 142 may be formed by thermal oxidation and/or thermal nitridation, and is formed only on semiconductor surfaces, i.e., on the surfaces of the prototypical strained epitaxial semiconductor structure 132P.

Alternately, the outer gate dielectric layer 142 may comprise a high dielectric constant (high-k) material comprising a dielectric metal oxide and having a dielectric constant that is greater than the dielectric constant of silicon nitride of 7.5. The composition and method of formation of the dielectric metal oxide is as described above.

Referring to FIGS. 17A and 17B, an outer gate electrode 160 is formed by deposition of a conductive material layer and lithographic patterning. The material for the outer gate electrode 160 is the same as the material of the gate electrode layer (60P, 50P, 45) of the first exemplary semiconductor structure in FIGS. 8A-8C, which subsequently forms the inner gate electrode 50 and the outer gate electrode 60. The thickness of the outer gate electrode 160 may be from about 20 nm to about 200 nm, and typically from about 50 nm to about 150 nm, although lesser and greater thicknesses are also contemplated herein. The length of the outer gate electrode 160 as measured in a horizontal direction in the plane B-B', which is the lengthwise direction of the prototypical strained epitaxial semiconductor structure 132P is equal to the channel length of the transistor to be subsequently formed in the prototypical strained epitaxial semiconductor structure 132P less twice the overlap between the outer gate electrode 160 and a source region or a drain region.

Referring to FIGS. 18A and 18B, a first photoresist 147 is applied over the second exemplary semiconductor structure and lithographically patterned to expose end portions of the prototypical strained epitaxial semiconductor structure 132P. The edges of the second photoresist 147 after patterning overlie the porous silicon portion 30'. An anisotropic etch is performed employing the first photoresist 147 as an etch mask, and exposed portions of the outer gate dielectric 142, the prototypical strained epitaxial semiconductor structure 132P, the silicon-germanium layer 131, and the porous silicon portion 30' are removed. Preferably, but not necessarily, the anisotropic etch is selective to the insulator layer 20. The anisotropic etch may be a reactive ion etch. Etch chemistries that etch silicon and a silicon germanium alloy selective to an insulator material such as silicon nitride or silicon oxide is known in the art. A first porous silicon portion end wall 48A and a second porous silicon portion end wall 48B are exposed by the anisotropic etch. The remaining portion of the prototypical strained epitaxial semiconductor structure 132P constitutes a strained epitaxial semiconductor structure 132. The exposed end walls of the strained epitaxial semiconductor structure 132 comprise a first epitaxial semiconductor end wall 49A and a second epitaxial semiconductor end wall 49B. The first photoresist 147 is subsequently removed.

Referring to FIGS. 19A and 19B, the porous silicon portion 30' is removed selective to the strained epitaxial semiconductor structure 132 by an etch, which may be a wet etch or a dry etch. The etch rate of the porous silicon portion 30' is higher, typically by orders of magnitude, than the etch rate of the strained epitaxial semiconductor structure 132 due to the presence of high density of pores in the porous silicon portion 30'. The first porous silicon portion end wall 48A and the second porous silicon portion end wall 48B provide entry points for etchants that remove the porous silicon portion 30' relative to the strained epitaxial semiconductor structure 132. Once the entirety of the porous silicon portion 30' is removed, a cavity C is formed within the enclosure of the silicon-germanium layer 131 and the insulator layer 20. Preferably, this etch is substantially isotropic. Also preferably, the etch is selective to both the outer gate dielectric 142 and the outer gate electrode 160. The etch may, or may not, be selective to the silicon-germanium layer 131.

Referring to FIGS. 20A and 20B, the silicon-germanium layer 131 is removed selective to the strained epitaxial semiconductor structure 132 by another etch, which may be a wet etch or a dry etch. An etch chemistry that removed a silicon germanium alloy selective to silicon is employed. Once the entirety of the silicon-germanium layer 131 is removed, the volume of the cavity C increases, and the cavity is enclosed by the strained epitaxial semiconductor structure 132 in the shape of semitubular geometry and the insulator layer 20. Preferably, the etch is substantially isotropic. Also preferably, the etch is selective to the outer gate dielectric 142 and the outer gate electrode 160.

Referring to FIGS. 20A and 20B, an inner gate dielectric 140 is formed on the exposed surfaces of the strained epitaxial semiconductor structure 132. The thickness of the inner gate dielectric 140 may be from about 1 nm to about 10 nm, and preferably from about 1.5 nm to about 3 nm. The inner gate dielectric 140 may have an effective oxide thickness (EOT) on the order of, or less than, 1 nm.

The inner gate dielectric 140 may comprise a silicon oxide based dielectric material, such as silicon oxide or silicon oxynitride. In this case, the inner gate dielectric 140 may be formed by thermal oxidation and/or thermal nitridation, and is formed only on semiconductor surfaces, i.e., on exposed surfaces of the strained epitaxial semiconductor structure 132, and on exposed surfaces of the outer gate electrode 160 if the outer gate electrode 160 comprises a semiconductor material that may be thermally oxidized and/or nitridated. The cavity C is enclosed by the inner gate dielectric 140 and the insulator layer 20.

Alternately, the inner gate dielectric 140 may comprise a high dielectric constant (high-k) material comprising a dielectric metal oxide and having a dielectric constant that is greater than the dielectric constant of silicon nitride of 7.5. The dielectric metal oxide has the same composition and thickness as described above. In this case, the strained epitaxial semiconductor structure 132, the outer gate dielectric 142, and the outer gate electrode 160 are encapsulated by the inner gate dielectric 140 and the insulator layer 20. The inner gate dielectric 140 is a single contiguous sheet connected throughout the entirety through horizontal portions directly on the insulator layer.

Referring to FIGS. 22A and 22B, dopants of the second conductivity type, which is the opposite of the first conductivity type, are then implanted into the strained epitaxial semiconductor structure 132 employing the outer gate electrode 160 as an implantation mask to form a source region 134 and a drain region 136. Angled ion implantations may be employed to deliver dopants uniformly within the source region 134 and the drain region 136. The source region 134 and the drain region 136 are self-aligned to the outer gate electrode 160. The overlap between the outer gate electrode 160 and the source and drain regions (134, 136) is controlled by the angle and energy of the ion implantation. The dopant concentration of the source region 134 and the drain region 136 may be from about $1.0\times10^{19}/cm^3$ to about $1.0\times10^{21}/cm^3$, and preferably from about $1.0\times10^{20}/cm^3$ to about $5.0\times10^{20}/cm^3$, although lesser and greater dopant concentrations are explicitly contemplated herein. The remaining portion of the strained epitaxial semiconductor structure 132, which has a doping of the first conductivity type, constitutes a body region 132'. Each of the source region 34 and the drain region 36 includes a portion of the horizontal layer, a portion of the first vertical layer, and a portion of the second vertical layer.

Referring to FIGS. 23A and 23B, a gate electrode layer 150L comprising a conductive material is formed within the cavity C and over the strained epitaxial semiconductor structure (132', 134, 136) and the outer gate electrode 160 by low pressure chemical vapor deposition (LPCVD), rapid thermal an atomic layer deposition (RTCVD), etc. The conductive material may be a semiconductor, a metal, or a conductive metal alloy, and may be the same as the conductive material of the gate electrode layer (50P, 60P, 45; see FIGS. 8A-8C) of the first exemplary semiconductor structure. Preferably, the thickness of the gate electrode layer 150L is selected to effect a complete filling of the cavity C. The gate electrode layer (50P, 60P, 45) and the insulator layer 20 encapsulate the strained epitaxial semiconductor structure (132', 134, 136), the outer gate electrode 160, and the inner gate dielectric 140. The volume of the cavity C is filled with the gate electrode layer 150L.

Figure 24A:
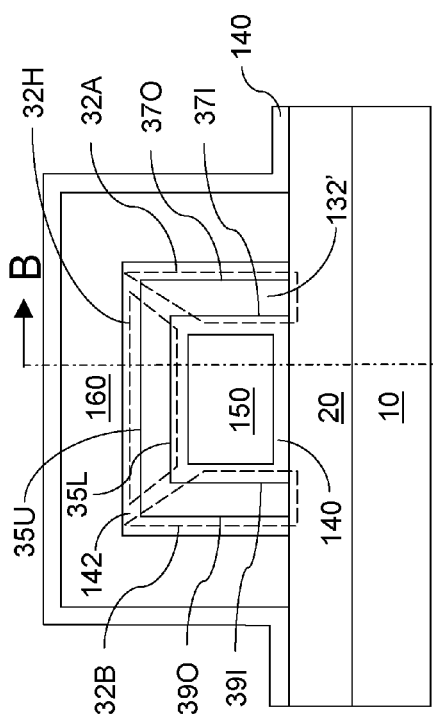
Figure 24B:
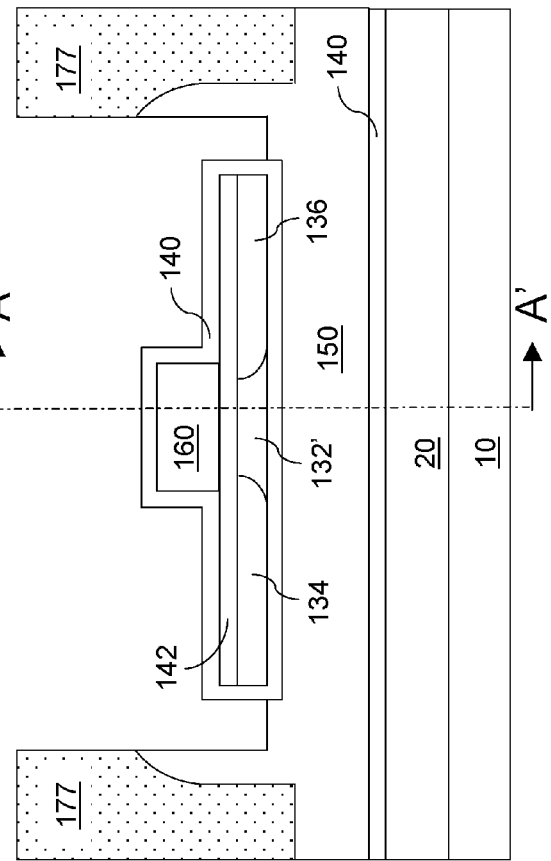

Referring to FIGS. 24A and 24B, a second photoresist 177 is applied over the second exemplary semiconductor structure and lithographically patterned to expose an area including the strained epitaxial semiconductor structure (132', 134, 136) and the outer gate electrode 160. In other words, the edges of the second photoresist 177 after lithographic patterning falls outside the area of the strained epitaxial semiconductor structure (132', 134, 136) and the outer gate electrode 160. The exposed portions of the gate electrode layer 150 is removed by an etch employing the second photoresist 177 as an etch mask. The etch is selective to the inner gate dielectric 140. In the alternative, the etch is selective to the outer gate dielectric 142, if the outer gate dielectric 142 is present over the outer surfaces of the strained epitaxial semiconductor structure (132', 134, 136). The etch may be anisotropic or substantially isotropic. Also, the etch may be a dry etch or a wet etch. The second photoresist 177 is subsequently removed.

The second exemplary structure of the present invention comprises:

a substrate (10, 20) including an insulator layer 20;

a strained epitaxial semiconductor structure (132', 134, 136) including a horizontal layer 32H separated from the insulator layer 20, a first vertical layer 32A vertically abutting the insulating layer 10, a second vertical layer 32B abutting the insulating layer 20 and not abutting the first vertical layer 32A;

an inner gate electrode 150 located between the first and second vertical layers (32A, 32B) and between the horizontal layer 32H and the insulating layer 20;

an outer gate electrode 160 located over the strained epitaxial semiconductor structure (132', 134, 136);

a body region 132' located in the epitaxial semiconductor structure (132', 134, 136) and having a doping of a first conductivity type;

a source region 134 having a doping of a second conductivity type and located at a first end of the epitaxial semiconductor structure (132', 134, 136), wherein the second conductivity type is the opposite of the first conductivity type;

a drain region 136 having a doping of the second conductivity type and located at second end of the epitaxial semiconductor structure (132', 134, 136) and separated from the source region.

an inner gate dielectric 140 abutting the inner gate electrode 150 and the epitaxial semiconductor structure (132', 134, 136); and an outer gate dielectric 142 abutting the outer gate electrode 160 and the epitaxial semiconductor structure (132', 134, 136).

The source region 134 protrudes out of a first end surface of the outer gate electrode 160, the drain region 136 protrudes out of a second end surface of the outer gate electrode 160, and the inner gate electrode 150 protrudes out of at least one end surface of the strained epitaxial semiconductor structure (132', 134, 136).

Referring to FIGS. 25A-25C, a dielectric material layer 80 is formed over the outer gate electrode 160, the source region 132, the drain region 136, the inner gate electrode 150, and the insulation layer 20. The dielectric material layer 80 has the same composition as in the first exemplary semiconductor structure. Various contact via holes are formed in the same manner as in the first embodiment.

The second exemplary semiconductor structure may be operated in the same manner as the first exemplary semiconductor structure. Specifically, one of the inner gate electrode 150 and the outer gate electrode 160 may operates as a normal gate electrode controlling the flow of current between the source region 134 and the drain region 136, while the other of the inner gate electrode 150 and the outer gate electrode 160 operates as a back gate electrode that applies an electrical bias having the same polarity relative to the source region 134 as the electrode that operates as the normal gate electrode. Alternately, the inner gate electrode 150 and the outer gate electrode 160 may be operated with voltages of opposite polarity relative to the source region 134 of the strained epitaxial semiconductor structure (132', 134, 136), which has a semitubular configuration, to induce an inversion layer on one side and an accumulation layer on the other side body region 132'. The operational conditions of the transistor may be selected to alter the amount of charge stored in the body region 132'.

While the second exemplary semiconductor structure may be operated in any of the mode that the first exemplary semiconductor structure may be operated in, the strain in the strained epitaxial semiconductor structure (132', 134, 136), and particularly, the strain in the body region 132' enhances charge carrier mobility of the second conductivity type. Thus, the on-current and other transistor characteristics of the transistor are improved over a structurally similar transistor without any built-in strain. The surface orientations of the strained epitaxial semiconductor structure (132', 134, 136) may be selected to optimize the gain in the charge carrier mobility.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
    a substrate including an insulator layer;
    an epitaxial semiconductor structure including a horizontal layer separated from said insulator layer, a first vertical layer vertically contacting said insulating layer, and a second vertical layer contacting said insulating layer and not contacting said first vertical layer, wherein an entirety of said epitaxial semiconductor structure is of integral construction and epitaxially aligned as a single crystal;
    an inner gate electrode insulated from said epitaxial semiconductor structure and located between said first and second vertical layers and between said horizontal layer and said insulating layer;
    an outer gate electrode insulated from said epitaxial semiconductor structure and located over said epitaxial semiconductor structure;
    an inner gate dielectric contacting sidewalls and a planar top surface of said inner gate electrode and a bottom surface of said epitaxial semiconductor structure; and
    an outer gate dielectric contacting a bottom surface of said outer gate electrode and outer sidewalls and a top surface of said epitaxial semiconductor structure.

2. The semiconductor structure of claim 1, wherein said inner gate dielectric and said outer gate dielectric comprise a same dielectric material.

3. The semiconductor structure of claim 1, wherein said horizontal layer has an upper surface and a lower surface, said first vertical layer has a first vertical inner wall and a first vertical outer wall, said second vertical layer has a second vertical inner wall and a second vertical outer wall, wherein said inner gate dielectric abuts said lower surface, said first vertical inner wall, and said second vertical inner wall, and wherein said outer gate dielectric abuts said upper surface, said first vertical outer wall, and said second vertical outer wall.

4. The semiconductor structure of claim 1, further comprising:

a body region located in said epitaxial semiconductor structure and having a doping of a first conductivity type;
a source region having a doping of a second conductivity type and located at a first end of said epitaxial semiconductor structure, wherein said second conductivity type is the opposite of said first conductivity type; and
a drain region having a doping of said second conductivity type and located at a second end of said epitaxial semiconductor structure and separated from said source region.

5. The semiconductor structure of claim 4, wherein said source region protrudes out of a first end surface of said outer gate electrode, said drain region protrudes out of a second end surface of said outer gate electrode, and said inner gate electrode protrudes out of an end surface of said epitaxial semiconductor structure.

6. A semiconductor structure comprising:
a substrate including an insulator layer;
a strained epitaxial semiconductor structure including a horizontal layer separated from said insulator layer, a first vertical layer vertically contacting said insulating layer, and a second vertical layer contacting said insulating layer and not contacting said first vertical layer, wherein an entirety of said strained epitaxial semiconductor structure is of integral construction, is epitaxially aligned as a single crystal, and has a substantially same strain throughout;
an inner gate electrode located between the first and second vertical layers and between the horizontal layer and the insulating layer;
an outer gate electrode located over the strained epitaxial semiconductor structure;
a body region located in said epitaxial semiconductor structure and having a doping of a first conductivity type;
a source region having a doping of a second conductivity type and located at a first end of said epitaxial semiconductor structure, wherein said second conductivity type is the opposite of said first conductivity type; and
a drain region having a doping of said second conductivity type and located at second end of said epitaxial semiconductor structure and separated from said source region, wherein said source region protrudes out of a first end surface of said outer gate electrode, said drain region protrudes out of a second end surface of said outer gate electrode, and said inner gate electrode protrudes out of an end surface of said strained epitaxial semiconductor structure.

7. A floating-body dynamic random access memory device comprising:
an insulator layer located on a substrate;
an epitaxial semiconductor structure including a horizontal layer separated from said insulator layer, a first vertical layer vertically contacting said insulating layer, and a second vertical layer contacting said insulating layer and not contacting said first vertical layer, wherein an entirety of said epitaxial semiconductor structure is of integral construction and epitaxially aligned as a single crystal;
an inner gate electrode insulated from said epitaxial semiconductor structure and located between said first and second vertical layers and between said horizontal layer and said insulating layer;
an outer gate electrode insulated from said epitaxial semiconductor structure and located over said epitaxial semiconductor structure.
a source region located at a first end of said epitaxial semiconductor structure;
a drain region located at a second end of said epitaxial semiconductor structure and separated from said source region;
a charge storage node in a center portion of said epitaxial semiconductor structure between said source region and said drain region, wherein said storage node is partially depleted to store electrical charges;
an inner gate dielectric contacting sidewalls and a planar top surface of said inner gate electrode and a bottom surface of said epitaxial semiconductor structure; and
an outer gate dielectric contacting a bottom surface of said outer gate electrode and outer sidewalls and a top surface of said epitaxial semiconductor structure.

8. The device of claim 7, wherein said charge storage node is a body region of said epitaxial semiconductor structure, and wherein said body region is a quasi-neutral floating body.

9. A semiconductor structure comprising:
a substrate including an insulator layer;
a strained epitaxial semiconductor structure including a horizontal layer separated from said insulator layer, a first vertical layer vertically contacting said insulating layer, and a second vertical layer contacting said insulating layer and not contacting said first vertical layer, wherein an entirety of said strained epitaxial semiconductor structure is of integral construction, is epitaxially aligned as a single crystal, and has a substantially same strain throughout;
an inner gate electrode located between the first and second vertical layers and between the horizontal layer and the insulating layer;
an outer gate electrode located over the strained epitaxial semiconductor structure;
a body region located in said epitaxial semiconductor structure and having a doping of a first conductivity type;
a source region having a doping of a second conductivity type and located at a first end of said epitaxial semiconductor structure, wherein said second conductivity type is the opposite of said first conductivity type;
a drain region having a doping of said second conductivity type and located at second end of said epitaxial semiconductor structure and separated from said source region;
an inner gate dielectric contacting sidewalls and a planar top surface of said inner gate electrode and a bottom surface of said epitaxial semiconductor structure; and
an outer gate dielectric contacting a bottom surface of said outer gate electrode and outer sidewalls and a top surface of said epitaxial semiconductor structure.

* * * * *